(12) United States Patent
Kawabata et al.

(10) Patent No.: US 8,026,614 B2
(45) Date of Patent: Sep. 27, 2011

(54) SEMICONDUCTOR IC-EMBEDDED SUBSTRATE AND METHOD FOR MANUFACTURING SAME

(75) Inventors: Kenichi Kawabata, Tokyo (JP); Takaaki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 153 days.

(21) Appl. No.: 12/435,385

(22) Filed: May 4, 2009

(65) Prior Publication Data
US 2009/0218678 A1    Sep. 3, 2009

Related U.S. Application Data

(62) Division of application No. 11/527,829, filed on Sep. 27, 2006, now Pat. No. 7,544,537.

(30) Foreign Application Priority Data

Sep. 28, 2005  (JP) ................................ 2005-282231
Feb. 27, 2006  (JP) ................................ 2006-050475

(51) Int. Cl.
*H01L 29/40*    (2006.01)
*H01L 23/48*    (2006.01)
*H01L 23/52*    (2006.01)

(52) U.S. Cl. .. 257/778; 257/678; 257/783; 257/E33.056

(58) Field of Classification Search ............. 257/678, 257/778, 783, E33.056
See application file for complete search history.

(56) References Cited

U.S. PATENT DOCUMENTS
2006/0021791 A1*  2/2006  Sunohara et al. ............. 174/255

FOREIGN PATENT DOCUMENTS

| JP | 2001-267366 | 9/2001 |
| JP | 2005-064470 | 3/2005 |
| JP | 2005-159226 | 6/2005 |
| JP | 2005-217372 | 8/2005 |
| JP | 2005-229065 | 8/2005 |
| JP | 2005-236039 A | 9/2005 |

OTHER PUBLICATIONS

Japanese Office Action received Jun. 2, 2009.

* cited by examiner

*Primary Examiner* — Asok K Sarkar
(74) *Attorney, Agent, or Firm* — Wolff Law Offices, PLLC; Kevin Alan Wolff

(57) ABSTRACT

A semiconductor IC-embedded substrate suitable for embedding a semiconductor IC in which the electrode pitch is extremely narrow. The substrate comprises a semiconductor IC 120 in which stud bumps 121 are provided to the principal surface 120a, a first resin layer 111 for covering the principal surface 120a of the semiconductor IC 120, and a second resin layer 112 for covering the back surface 120b of the semiconductor IC 120. The stud bumps 121 of the semiconductor IC 120 protrude from the surface of the first resin layer 111. The method for causing the stud bumps 121 to protrude from the surface of the first resin layer 111 may involve using a wet blasting method to cause an overall reduction of the thickness of the first resin layer 111. The stud bumps 121 can thereby be properly uncovered even when the electrode pitch of the semiconductor IC 120 is narrow.

14 Claims, 28 Drawing Sheets

SEMICONDUCTOR IC-EMBEDDED SUBSTRATE AND METHOD FOR MANUFACTURING SAME

This patent application is a divisional application of U.S. Patent Application Ser. No. 11/527,829 filed on Sep. 27, 2006, which is hereby incorporated herein for all purposes, and which claims prority to Japanese Patent Application No. 2005-282231filed on Sep. 28, 2005 and Japanese Patent Applicationn No. 2006-050475 filed on Feb. 27, 2006.

TECHNICAL FIELD

The present invention relates to a semiconductor IC-embedded substrate and to a method for manufacturing the same, and particularly relates to a semiconductor IC-embedded substrate that is suitable for embedding a semiconductor IC in which the electrode pitch is extremely narrow, and to a method for manufacturing the same.

BACKGROUND OF THE INVENTION

Numerous proposals have been made in recent years for mounting a semiconductor IC on a printed circuit board in a bare-chip state in order to satisfy the requirements of smaller size and thinner profile for a semiconductor IC mounting module. A semiconductor IC in a bare-chip state has an extremely narrow electrode pitch compared to a packaged semiconductor IC. Therefore, when a bare-chip semiconductor IC is mounted on a printed circuit board, a critical issue is the manner in which an electrode (hereinafter referred to as a "pad electrode") provided to a semiconductor IC is connected to wiring (hereinafter referred to as a "wiring pattern") provided to the printed circuit board.

Wire bonding is known as one method for connecting a pad electrode with a wiring pattern. This method allows a semiconductor IC in a bare-chip state to be packaged with relative ease, but the region in which the semiconductor IC is mounted must be in a different plane on the substrate from the region in which the bonding wire is connected. This method therefore has drawbacks in that the package surface area is enlarged.

Other known methods for connecting a pad electrode to a wiring pattern include a method whereby a flip-chip connection is made between a printed circuit board and a semiconductor IC that is in a bare-chip state. Although the size of the packaging area can be reduced by this method, this method has drawbacks in that a complicated process is involved in creating multiple layers of under barrier metal that must be formed on the surface of the pad electrode in order to adequately maintain the mechanical strength of the connection between the pad electrode and the wiring pattern.

Since both of the methods described above involve mounting a semiconductor IC on the surface of a printed circuit board, the difficulty of reducing the thickness of the module as a whole is a drawback that is common to both methods. Methods for overcoming this drawback are described in Japanese Laid-open Patent Application Nos. H9-321408, 2002-246500, 2001-339165, 2002-50874, 2002-170840, 2002-246507, and 2003-7896. In these methods, a cavity is formed in a printed circuit board, a bare-chip semiconductor IC is embedded in the cavity, and a semiconductor IC-embedded substrate is formed thereby.

However, in the methods described in Japanese Laid-open Patent Application Nos. H9-321408, 2002-246500, 2001-339165, 2002-50874, 2002-170840, 2002-246507, and 2003-7896, the thickness of the printed circuit board must be increased to a certain degree in order to maintain the strength of the portion in which the cavity is formed. This increase in thickness is a drawback in that it interferes with reducing the thickness of the module. Furthermore, since the size of the cavity in its planar direction must be set so as to be somewhat larger than the size of the semiconductor IC in its planar direction, the pad electrode and the wiring pattern become misaligned with each other, and it is therefore extremely difficult to utilize a semiconductor IC that has a narrow electrode pitch of 100 µm or less.

Since each pad electrode is exposed by laser irradiation when a semiconductor IC is embedded, as the electrode pitch of the semiconductor IC becomes narrower, even higher precision is required for the process, and the processing time also increases in proportion to the number of pad electrodes. The diameter of a via formed by laser irradiation must also be reduced as the electrode pitch of the semiconductor IC becomes narrower, and drawbacks therefore occur in that it becomes difficult to perform desmearing of the inside of the via.

However, Japanese Laid-open Patent Application No. 2005-64470 discloses a method whereby semiconductor IC is fixed to a transfer board, and in this state, a post electrode provided to a printed circuit board is inserted in a positioning hole provided to the transfer board. The semiconductor IC is thereby embedded in an uncured or partially cured resin layer, and the pad electrode is then exposed by polishing or blasting. According to this method, not only can a semiconductor IC be positioned with high precision, but it is also possible to overcome the drawbacks described above that occur when each pad electrode is exposed by laser irradiation.

However, the method described in Japanese Laid-open Patent Application No. 2005-64470 has drawbacks in that constraints are imposed by the requirement that a post electrode be formed in advance on the printed circuit board. Since a transfer board must also be manufactured, this method cannot be considered suitable for the manufacture of all semiconductor IC-embedded substrates.

Although not related to methods for manufacturing a semiconductor IC-embedded substrate, examples of methods that use polishing or blasting to uncover an electrode provided to a semiconductor IC are described in Japanese Laid-open Patent Application Nos. H11-274241, 2001-250902, and 2003-197655.

SUMMARY OF THE INVENTION

Various drawbacks occur when the conventional methods are used to embed a semiconductor IC that has a narrow electrode pitch in a substrate. The present invention was developed in order to overcome such drawbacks, and an object of the present invention is to provide a semiconductor IC-embedded substrate and manufacturing method that are suitable for embedding a semiconductor IC in which the electrode pitch is extremely narrow.

The semiconductor IC-embedded substrate according to the present invention comprises a semiconductor IC in which conductive protrusions are provided to a principal surface of the semiconductor IC, a first resin layer for covering the principal surface of the semiconductor IC, and a second resin layer for covering a back surface of the semiconductor IC, wherein the conductive protrusions of the semiconductor IC protrude from a surface of the first resin layer. It is preferred that at least one of layers selected from the first and second resin layers be in contact with a side surface of the semiconductor IC. It is also preferred that the first resin layer be in contact with the principal surface of the semiconductor IC, and that the second resin layer be in contact with the back surface of the semiconductor IC.

A die attach film may be provided to either the principal surface or the back surface of the semiconductor IC, and either the principal surface or the back surface of the semiconductor IC may be covered by one layer selected from the first and second resin layers via the die attach film.

It is preferred that the semiconductor IC-embedded substrate according to the present invention further comprise a through-electrode that is provided through the first and second resin layers. It is more preferred that the semiconductor IC be endowed with a thin profile.

It is preferred that the semiconductor IC-embedded substrate according to the present invention further comprise a wiring pattern formed on the surface of the first resin layer and connected to the conductive protrusions, wherein a width of the wiring pattern on the conductive protrusions is smaller than a diameter of a protruding portions of the conductive protrusions.

The method for manufacturing a semiconductor IC-embedded substrate according to the present invention comprises a first step for inserting, between first and second resin layers, a semiconductor IC in which conductive protrusions are provided to a principal surface; a second step for causing the conductive protrusions of the semiconductor IC to protrude from a first surface of the first resin layer by reducing a thickness of the first resin layer; and a third step for forming a wiring pattern on the first surface of the first resin layer.

It is preferred that the second step comprise reducing a thickness by wet blasting one surface of the first resin layer.

It is also preferred that the first step include a step for stacking a second surface of the first resin layer and the principal surface of the semiconductor IC so as to face each other, and a step for stacking a first surface of the second resin layer and a back surface of the semiconductor IC so as to face each other. In this case, the semiconductor IC is preferably mounted on the second surface of the first resin layer in the first step, based on alignment marks that are formed on the first surface or second surface of the first resin layer.

It is also preferred that the first step be performed in a state in which a first support substrate is affixed on a first side of the first resin layer. It is more preferred in this case that a step for affixing a second support substrate on a second side of the second resin layer, and a step for peeling the first support substrate from a first side of the first resin layer be performed subsequent to the first step and prior to the second step.

The first step preferably includes a step for stacking a first surface of the second resin layer and a back surface of the semiconductor IC so as to face each other, and a step for stacking a second surface of the first resin layer and the principal surface of the semiconductor IC so as to face each other. It is preferred in this case that the semiconductor IC be mounted on the first surface of the second resin layer in the first step, based on alignment marks that are formed on the first surface or second surface of the second resin layer. It is more preferred that the first step be performed in a state in which a second support substrate is affixed on a second side of the second resin layer.

It is preferred that a width of the wiring pattern on the conductive protrusions be set in the third step so as to be smaller than a diameter of protruding portions of the conductive protrusions. It is also preferred that the method for manufacturing a semiconductor IC-embedded substrate according to the present invention further comprise a fourth step for forming a through-electrode that penetrates through the first and second resin layers.

According to the present invention, the method for exposing conductive protrusions provided to a semiconductor IC involves reducing the overall thickness of the first resin layer by a wet blasting method or other method, rather than using laser irradiation. Therefore, the conductive protrusions can be properly uncovered even when the electrode pitch is narrow. The protrusions can also be uncovered in a short time regardless of the number of conductive protrusions. Since there is no smearing that occurs when a laser is used to form minute vias, the desmearing process may also be omitted.

A highly precise mounting position can also be obtained by using alignment marks as a positioning reference during mounting of the semiconductor IC.

Setting the width of the wiring pattern formed on the first resin layer so as to be smaller than the diameter of the protruding portions of the conductive protrusions also makes it possible to prevent short-circuit defects from occurring when the electrode pitch is particularly narrow.

These aspects of the present embodiment make it possible to overcome the various drawbacks that occur when conventional techniques are used to embed a semiconductor IC having a narrow electrode pitch into a substrate.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
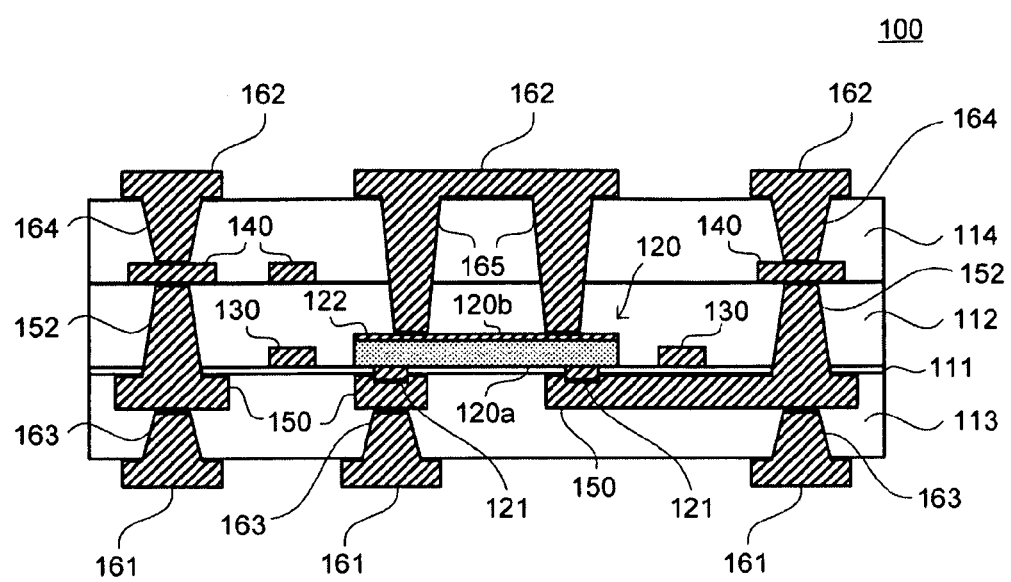
FIG. 1 is a schematic sectional view showing the structure of a semiconductor IC-embedded substrate according to a first preferred embodiment of the present invention.

FIG. 1 is a schematic sectional view showing the structure of the semiconductor IC-embedded substrate 100 according to a first preferred embodiment of the present invention.

As shown in FIG. 1, the semiconductor IC-embedded substrate 100 according to the present embodiment is composed of layered resin layers 111 through 114; a semiconductor IC 120 embedded between the resin layers 111 and 112; alignment marks 130; various types of wiring patterns 140, 150, 161, 162; and through-electrodes 152 and 163 through 165. Stud bumps 121 that are a type of conductive protrusion are formed on pad electrodes (not shown in FIG. 1) of the semiconductor IC 120, and each pad electrode is electrically connected to a wiring pattern 150 via the corresponding stud bump 121. The stud bumps 121 protrude from the surface of the resin layer 111, as shown in FIG. 1.

However, the conductive protrusions provided to the semiconductor IC 120 in the present invention are not limited to being stud bumps, and plate bumps, plating bumps, ball bumps, and various other types of bumps may be used. When stud bumps are used as the conductive protrusions, the stud bumps may be formed by wire bonding of silver or copper. When plate bumps are used, the plate bumps may be formed by plating, sputtering, or vapor deposition. When plating bumps are used, the bumps may be formed by plating. When ball bumps are used, the bumps may be formed by a process in which a solder ball is mounted on a land electrode and then melted, or cream solder is printed on a land electrode and then melted. The types of metals that can be used in the conductive protrusions are not particularly limited, and examples of metals that can be used include gold (Au), silver (Ag), copper (Cu), nickel (Ni), tin (Sn), chromium (Cr), nickel/chromium alloy (Ni—Cr), solder, and the like. It is also possible to use conical bumps, cylindrical bumps, or bumps having another shape that are formed by screen printing and curing an electrically conductive material; or bumps that are formed by printing a nanopaste and sintering the nanopaste by heating.

The height of the stud bumps 121 and other conductive protrusions is preferably set to about 5 to 200 μm, and a height of about 10 to 80 μm is particularly preferred. The reason for this is that when the height is less than 5 μm, the resin layer 111 that covers the principal surface 120a of the semiconductor IC 120 is entirely removed in the step described hereinafter for uncovering the stud bumps 121, and there is a risk of damage to the principal surface 120a of the semiconductor IC 120. On the other hand, it is difficult to form conductive protrusions that are over 200 μm high, and a significant variation in height also occurs.

Although not shown in FIG. 1, a capacitor and other passive components may be mounted to at least one of the wiring patterns 161, 162 of the outermost layer.

In the semiconductor IC-embedded substrate 100 according to the present embodiment, the embedded semiconductor IC 120 is reduced in thickness through the use of polishing, whereby the overall thickness of the semiconductor IC-embedded substrate 100 can be reduced to 1 mm or less, or to about 200 μm, for example. As will be described hereinafter, the semiconductor IC 120 in the present embodiment is aligned with respect to the alignment marks 130. There is therefore an extremely low occurrence of misalignment between the positions of each stud bump 121 in the planar direction and the relative positioning of each type of wiring pattern 140, 150, 161 and 162.

Figure 2:
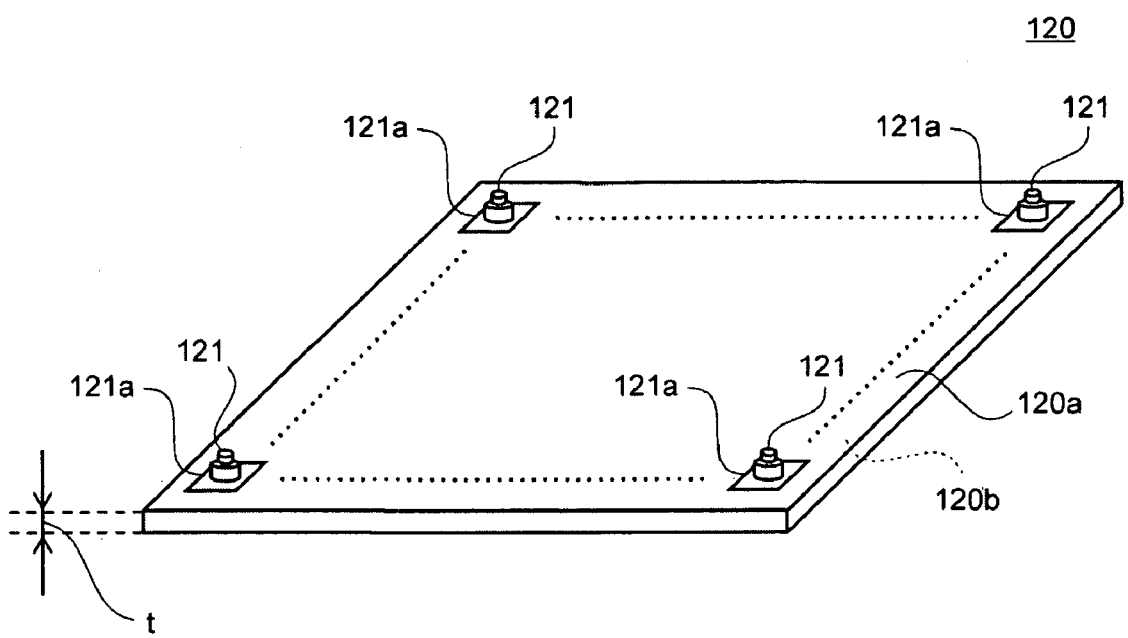
FIG. 2 is a schematic perspective view showing the structure of a semiconductor IC.

FIG. 2 is a schematic perspective view showing the structure of the semiconductor IC 120.

As shown in FIG. 2, the semiconductor IC 120 is in a bare-chip state, and numerous pad electrodes 121a are provided to the principal surface 120a of the semiconductor IC. In the semiconductor IC-embedded substrate 100 according to the present embodiment as described hereinafter, since all of the stud bumps 121 are uncovered at once by a wet blasting method, this process is free of the drawbacks of the prior art that occur when the pad electrodes are exposed by laser irradiation. Therefore, it is possible to use a semiconductor IC in which the pitch (electrode pitch) of the pad electrodes 121a is extremely narrow, being 100 μm or less, or 60 μm, for example. However, this configuration is not limiting.

A back surface 120b of the semiconductor IC 120 is polished, whereby the thickness t (distance from the principal surface 120a to the back surface 120b) of the semiconductor IC 120 is extremely small compared to an ordinary semiconductor IC. The thickness t of the semiconductor IC 120 is not particularly limited, but is preferably set to 200 μm or less, or about 20 to 100 μm, for example. It is preferred that the back surface 120b be polished for multiple semiconductor ICs at once while in the wafer state, and the semiconductor ICs 120 be then separated from each other by dicing. When dicing is performed to separate individual semiconductor ICs 120 prior to reducing the thickness by polishing, operational efficiency is improved by polishing the back surface 120b in a state in which the principal surface 120a of the semiconductor IC 120 is covered by a heat-curable resin or the like.

In the present invention, however, the method used to endow the semiconductor IC 120 with a thin profile is not limited to polishing, and it is also possible to use a thickness-reducing method that involves etching, plasma treatment, laser irradiation, or a blasting treatment, for example.

Stud bumps 121 are formed on the pad electrodes 121a. The size of the stud bumps 121 may be appropriately set according to the electrode pitch. For example, when the electrode pitch is approximately 100 μm, the stud bumps 121 may have a diameter of about 30 to 80 μm and a height of about 10 to 80 μm. The stud bumps 121 may be formed on the pad electrodes 121a by using a wire bonder after the individual semiconductor ICs 120 are separated by dicing. The material used to form the stud bumps 121 is not particularly limited, but the use of copper (Cu) is preferred. When copper (Cu) is used as the material for forming the stud bumps 121, a high-strength bond to the pad electrodes 121a can be obtained, and reliability is enhanced in comparison to a case in which gold (Au) is used.

In the semiconductor IC-embedded substrate 100 according to the present embodiment as shown in FIG. 1, the principal surface 120a of the semiconductor IC 120 is directly covered by the resin layer 111, and the back surface 120b of the semiconductor IC 120 is directly covered by the resin layer 112. The stud bumps 121 of the semiconductor IC 120 protrude from the surface of the resin layer 111, and are connected to the wiring pattern 150 by the protruding portions thereof.

A metal layer 122 is formed on the back surface 120b of the semiconductor IC 120. The metal layer 122 functions as a dissipation pathway for heat generated by the operation of the semiconductor IC 120, and more effectively prevents cracking from occurring in the back surface 120b of the semiconductor IC 120. The metal layer 122 also serves to enhance the handling properties of the semiconductor IC 120.

A through-electrode 165 provided so as to penetrate through the resin layers 112, 114 connects the metal layer 122 to a wiring pattern 162 formed on the outermost layer. Since the through-electrode 165 functions as a dissipation pathway for heat generated by the semiconductor IC 120, heat can be released to a motherboard with extremely high efficiency. Therefore, although the type of semiconductor IC 120 is not particularly limited, it is possible to select as the semiconductor IC 120 a digital IC that has an extremely high operating frequency, such as a CPU or DSP.

The material used to form the resin layers 111 through 114 may be a heat-curable resin or a thermoplastic resin insofar as the material has reflow resistance. Specific materials that may be selected include epoxy resins, bismaleimide triazine resins (BT resin), phenol resins, vinyl benzyl resins, polyphenylene ether (polyphenylene ether oxide) resins (PPE, PPO), cyanate resins, benzoxazine resins, polyimide resins, aromatic polyester resins, polyphenylene sulfide resins, polyether imide resins, polyarylate resins, polyester ether ketone resins, and the like. It is also possible to use a material in which a nonwoven cloth formed from glass cloth, aramid fibers, an aromatic polyester, or the like is impregnated with a resin described above, or a material in which a filler is added to a resin described above.

The method for manufacturing the semiconductor IC-embedded substrate 100 shown in FIG. 1 will next be described with reference to the drawings.

FIGS. 3 through 22 are process diagrams used to describe the method for manufacturing the semiconductor IC-embedded substrate 100 shown in FIG. 1.

Figure 3:
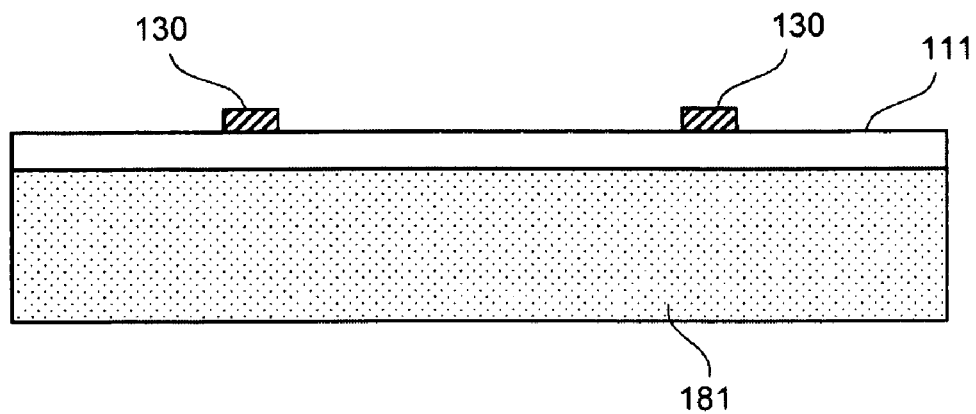
FIG. 3 is process diagram showing a process of forming an alignment mark that is a part of the manufacturing process of the semiconductor IC-embedded substrate shown in FIG. 1.

First, a resin layer 111 is prepared on which alignment marks 130 are formed, and a support substrate 181 is affixed to the resin layer 111, as shown in FIG. 3. The alignment marks 130 may be formed by patterning a conductive layer that is formed on the surface of the resin layer 111, or may be formed on the surface of the resin layer 111 by a transfer method. Regardless of which of these methods is used, the alignment marks 130 are used to position the semiconductor IC 120, making it necessary to properly control the position in which the alignment marks 130 are formed. The alignment marks 130 may be substituted by an actual wiring pattern, or may be a pattern used exclusively for alignment.

The material used to form the support substrate 181 is not particularly limited, and it is possible to use nickel (Ni) or stainless steel, for example. The thickness of the support substrate 181 is not particularly limited insofar as the necessary mechanical strength is ensured, and the thickness may be set to about 50 to 2,000 μm, for example. On the other hand, the resin layer 111 must have a thickness that is at least greater than the height of the stud bumps 121.

Figure 4:
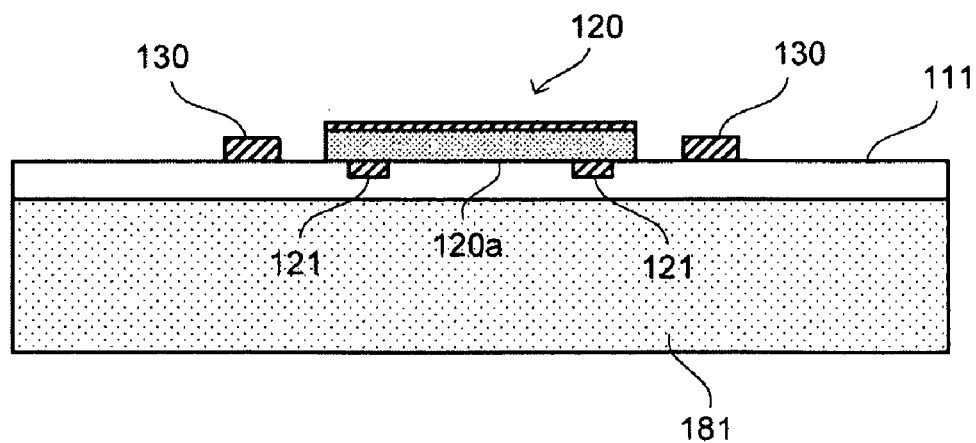
FIG. 4 is a process diagram showing a process of mounting the semiconductor IC that is a part of the manufacturing process of the semiconductor IC-embedded substrate shown in FIG. 1.

The semiconductor IC 120 is then mounted on the surface of the resin layer 111 while being positioned using the alignment marks 130, as shown in FIG. 4. In the present embodiment, the semiconductor IC 120 is mounted face-down, or with the principal surface 120a facing downward. When a heat-curable resin is used as the resin layer, the resin layer 111 is melted at this time by heating. When a thermoplastic resin is used as the resin layer, the stud bumps 121 sink into the resin layer 111 due to the elasticity of the thermoplastic resin. The semiconductor IC 120 is thereby temporarily fixed to the resin layer 111. The resin layer 111 and the principal surface 120a of the semiconductor IC 120 are also in contact with each other. When the material used to form the resin layer 111 is a heat-curable resin, complete fixing is achieved by heating the assembly. When a thermoplastic resin is used, fixing is achieved by heating/melting to increase adhesion.

Figure 5:
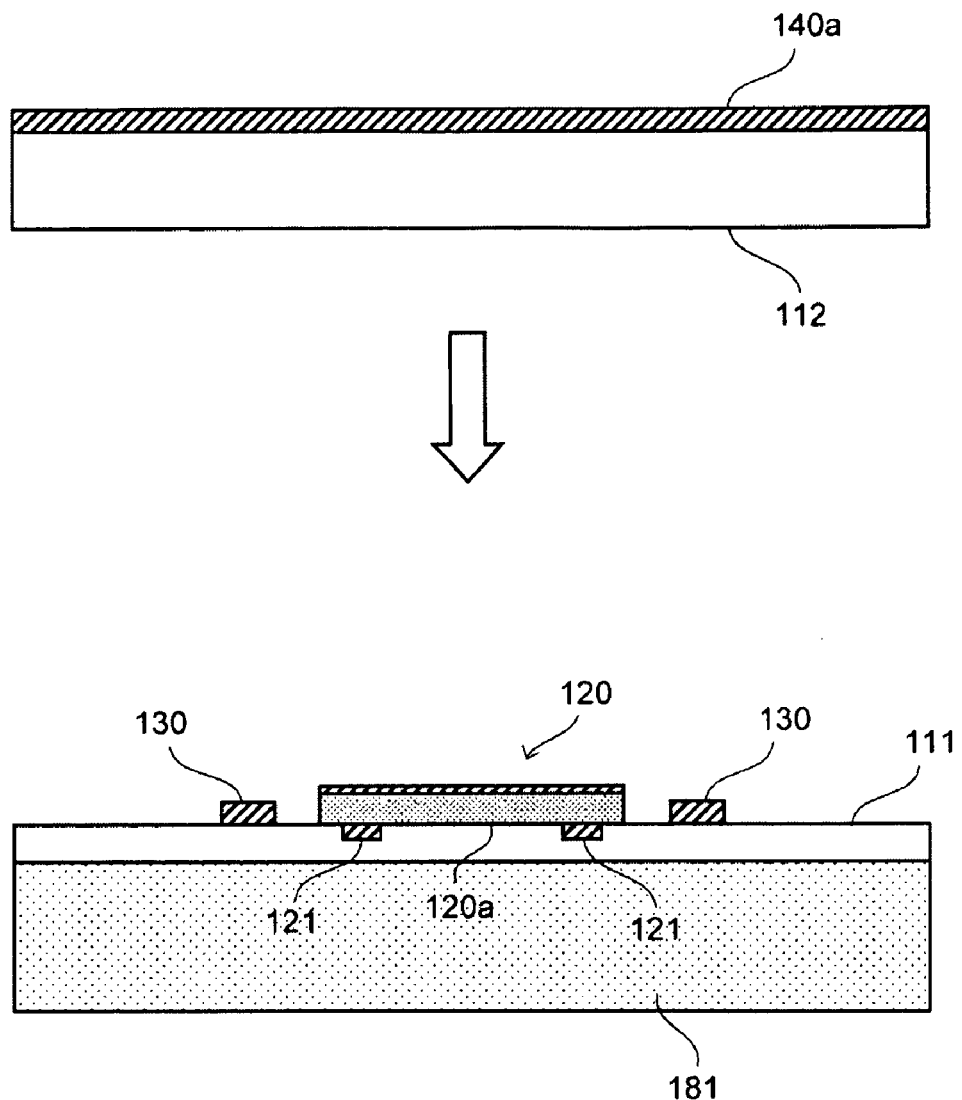
FIG. 5 is a process diagram showing a process of pressing a resin layer that is a part of the manufacturing process of the semiconductor IC-embedded substrate shown in FIG. 1.
Figure 6:
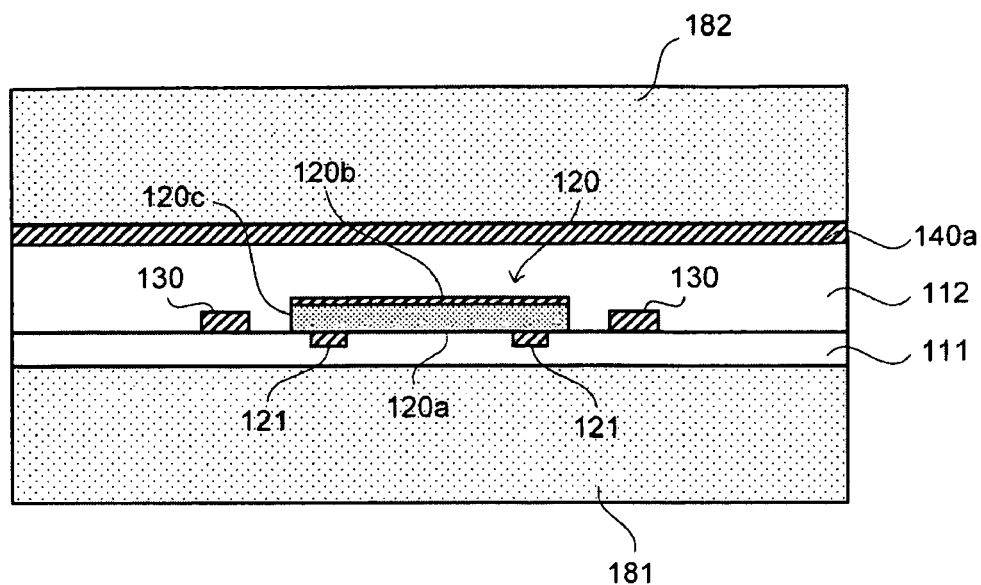
FIG. 6 is a process diagram showing a process of affixing a support substrate that is a part of the manufacturing process of the semiconductor IC-embedded substrate shown in FIG. 1.

A layered sheet composed of a conductor layer 140a and a resin layer 112 in an uncured or partially cured state is then stacked so that the resin layer 112 and the back surface 120b of the semiconductor IC 120 face each other, and the assembly is pressed together while being heated, as shown in FIG. 5. The resin layer 112 is thereby cured, and a state occurs in which the back surface 120b and side surface 120c of the semiconductor IC 120 are completely covered by the resin layer 112, as shown in FIG. 6. When the material forming the resin layer 112 is a thermoplastic material, the same state is attained by hot-pressing the assembly after the stacking step. In other words, a state occurs at this time in which the semiconductor IC 120 is held between the resin layers 111 and 112.

Figure 7:
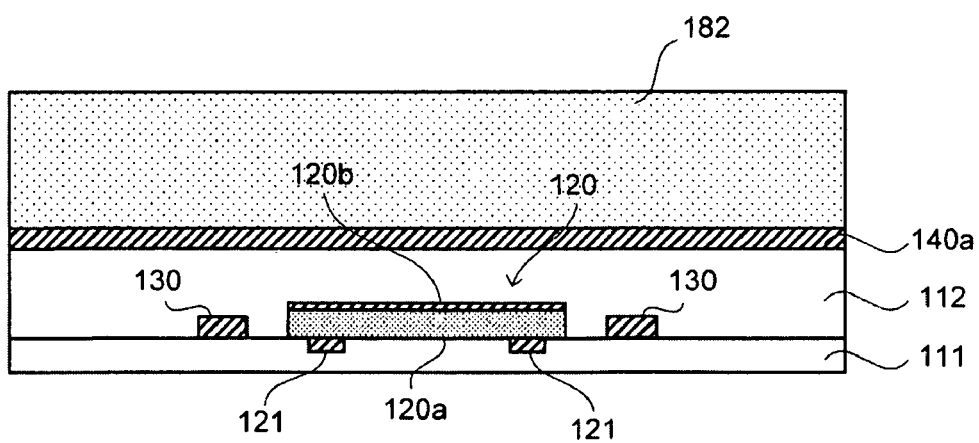
FIG. 7 is a process diagram showing a process of peeling off the resin layer that is a part of the manufacturing process of the semiconductor IC-embedded substrate shown in FIG. 1.

As shown in FIG. 6, another support substrate 182 is then affixed to the surface on the opposite side from the support substrate 181 as viewed from the semiconductor IC 120. After the other support substrate 182 is affixed in this manner, the support substrate 181 that was affixed earlier is peeled off, as shown in FIG. 7.

Figure 8:
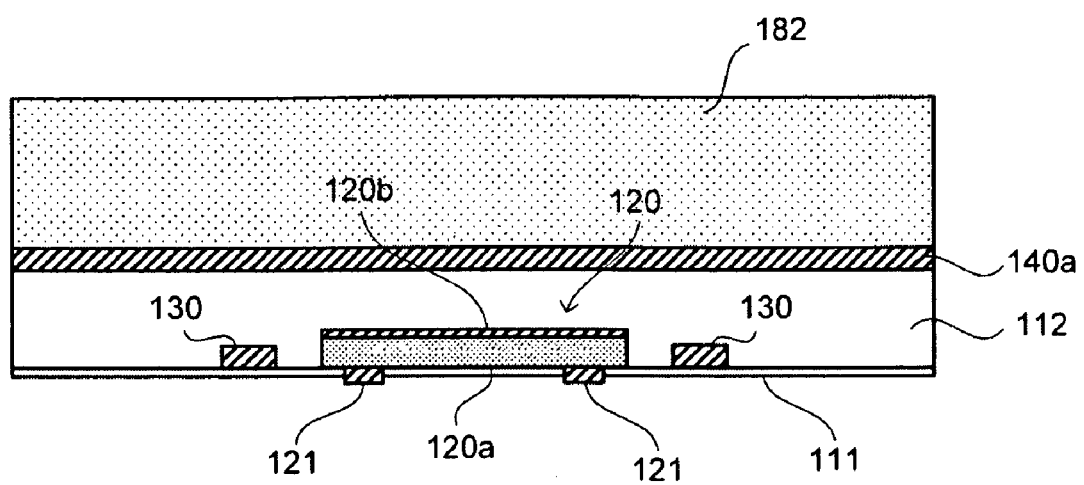
FIG. 8 is a process diagram showing a process of etching the resin layer that is a part of the manufacturing process of the semiconductor IC-embedded substrate shown in FIG. 1.

The surface of the resin layer 111 is then etched using a wet blasting method, as shown in FIG. 8. The etching rate in the wet blasting method varies according to the malleability of the material being etched. Specifically, the etching rate is high for a material (cured resin or the like) that has relatively low malleability, and the etching rate is low for a material (metal or the like) that has relatively high malleability. Therefore, when the surface of the resin layer 111 is etched by a wet blasting method, the stud bumps 121 provided to the semiconductor IC 120 can be caused to protrude from the surface of the resin layer 111 by adjusting the etching rate/etching conditions. The amount of protrusion is not particularly limited, but is preferably set to about 0.1 to 20 μm.

The method used to reduce the thickness of the resin layer 111 is not limited to a wet blasting method, and a dry blasting method, an ion milling method, a plasma etching method, or another etching method may be used. However, a wet blasting method has high precision and excellent working efficiency, and enables an adequate selection ratio to be maintained, and is therefore greatly preferred for use. Polishing that uses a buffer or the like is unsuitable as the method for reducing the thickness of the resin layer 111 in the present invention. The reason for this is that in polishing using a buffer or the like, the stud bumps 121 and the resin layer 111 are in the same plane, and not only is it impossible for the stud bumps 121 to protrude, but certain polishing conditions can also cause the conductive material that constitutes the stud bumps 121 to form a line in the rotation direction, which can cause a short circuit.

Since the method for exposing the stud bumps 121 involves an overall reduction of the thickness of the resin layer 111 by wet blasting or another method, and not forming a laser via in the resin layer 111 by conventional laser irradiation, the stud bumps 121 can be properly uncovered all at once even when the electrode pitch is narrow.

Figure 9:
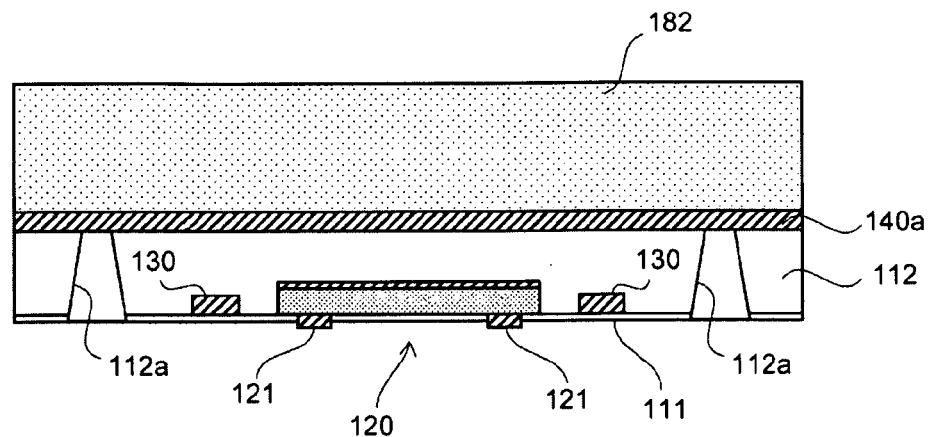
FIG. 9 is a process diagram showing a process of forming through-holes that is a part of the manufacturing process of the semiconductor IC-embedded substrate shown in FIG. 1.

As shown in FIG. 9, through-holes 112a that penetrate through the resin layers 111 and 112 are then formed by laser irradiation from the direction of the resin layer 111. However, a method other than laser irradiation may also be used to form the through-holes 112a.

Figure 10:
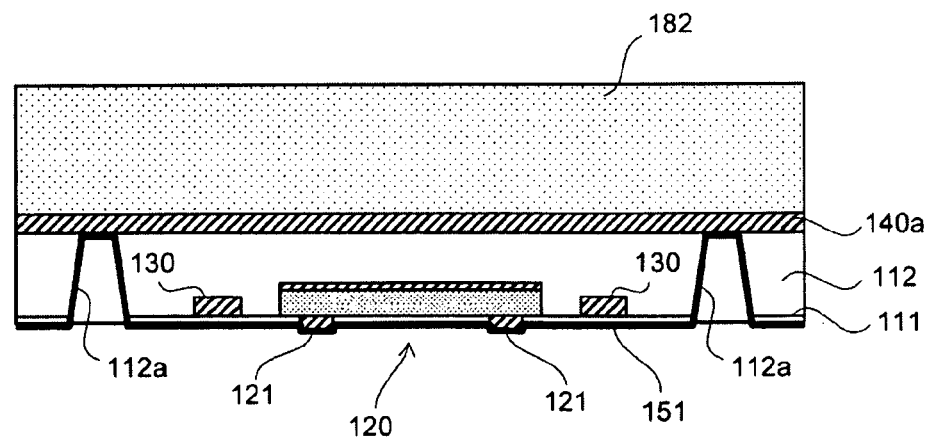
FIG. 10 is a process diagram showing a process of forming a base conductor layer that is a part of the manufacturing process of the semiconductor IC-embedded substrate shown in FIG. 1.

As shown in FIG. 10, a sputtering method or other vapor-phase growth method is used to form a thin base conductor layer 151 on the entire surface of the resin layer 111 including the insides of the through-holes 112a. The protruding portions of the stud bumps 121 and the portions of the conductor layer 140a that are exposed at the bottoms of the through-holes 112a are thereby directly covered by the base conductor layer 151. However, an electroless plating method or a vapor deposition method may be used instead of vapor-phase growth to form the base conductor layer 151. Since the unnecessary portion of the base conductor layer 151 is subsequently removed, the base conductor layer 151 must have an adequately small thickness of about 0.005 to 3 μm, or preferably 0.3 to 2 μm, for example.

In the present embodiment, since the stud bumps 121 protrude from the surface of the resin layer 111, there is no need to remove etching residue or perform other pre-processing prior to forming the base conductor layer 151. In other words, when the stud bumps 121 and the resin layer 111 are in the same plane, the surfaces of the stud bumps 121 can become covered by etching residue, and conduction defects can occur if the base conductor layer 151 is formed in this state. In contrast, a wet blasting treatment is performed in the present embodiment under conditions whereby the stud bumps 121 protrude from the surface of the resin layer 111. Since the etching residue is thereby reliably removed from the surfaces of the stud bumps 121, the base conductor layer 151 can be formed without any preprocessing.

Figure 11:
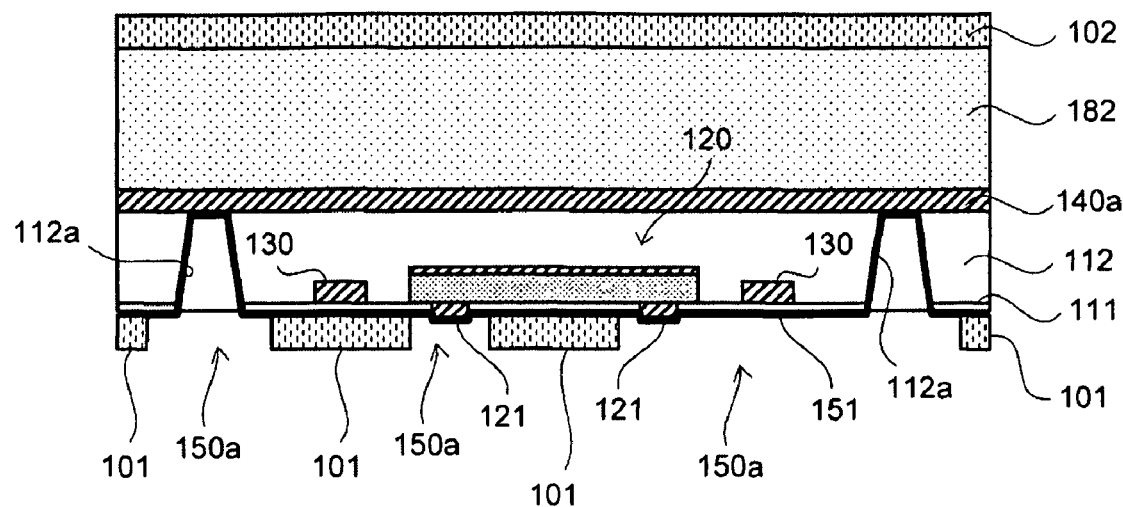
FIG. 11 is a process diagram showing a process of affixing and exposing dry films that is a part of the manufacturing process of the semiconductor IC-embedded substrate shown in FIG. 1.

Light-sensitive dry films 101, 102 are then affixed to both surfaces of the substrate, i.e., to the surface of the base conductor layer 151 and the surface of the support substrate 182, as shown in FIG. 11. The dry films 101 are then exposed using a photomask not shown in the drawing, and the dry films 101 are removed from the regions 150a in which the wiring pattern 150 is to be formed. The base conductor layer 151 is thereby exposed in the regions 150a in which the wiring pattern 150 is to be formed.

The dry film 102 is not removed at this time, thus maintaining a state in which the entire surface of the support substrate 182 is essentially covered. The thickness of the dry films 101 must be set so as to be somewhat greater than that of the wiring pattern 150. When the thickness of the wiring pattern 150 is about 20 μm, for example, the thickness of the dry films 101 may be set to about 25 μm. The dry film 102, however, is provided for the purpose of preventing the surface of the support substrate 182 from being plated, and may have any thickness.

As shown in FIG. 11, regions that correspond to the stud bumps 121 are included in the regions 150a in which the wiring pattern 150 is to be formed. When a semiconductor IC 120 having an extremely narrow electrode pitch is used, there is no allowance for significant misalignment of the positions of the stud bumps 121 and the regions 150a relative to each other in the planar direction. However, in the present embodiment, since the semiconductor IC 120 is aligned with respect to the alignment marks 130, it is possible to minimize misalignment between the positions of the stud bumps 121 and the positions of the regions 150a in the planar direction.

In the example shown in FIG. 11, the width of the regions 150a in which the wiring pattern 150 is to be formed is set so as to be larger than the diameter of the stud bumps 121. However, when the electrode pitch is particularly narrow, a manufacturing margin can be maintained by setting the width of the wiring pattern 150 formation regions 150a so as to be smaller than the diameter of the stud bumps 121.

Figure 12:
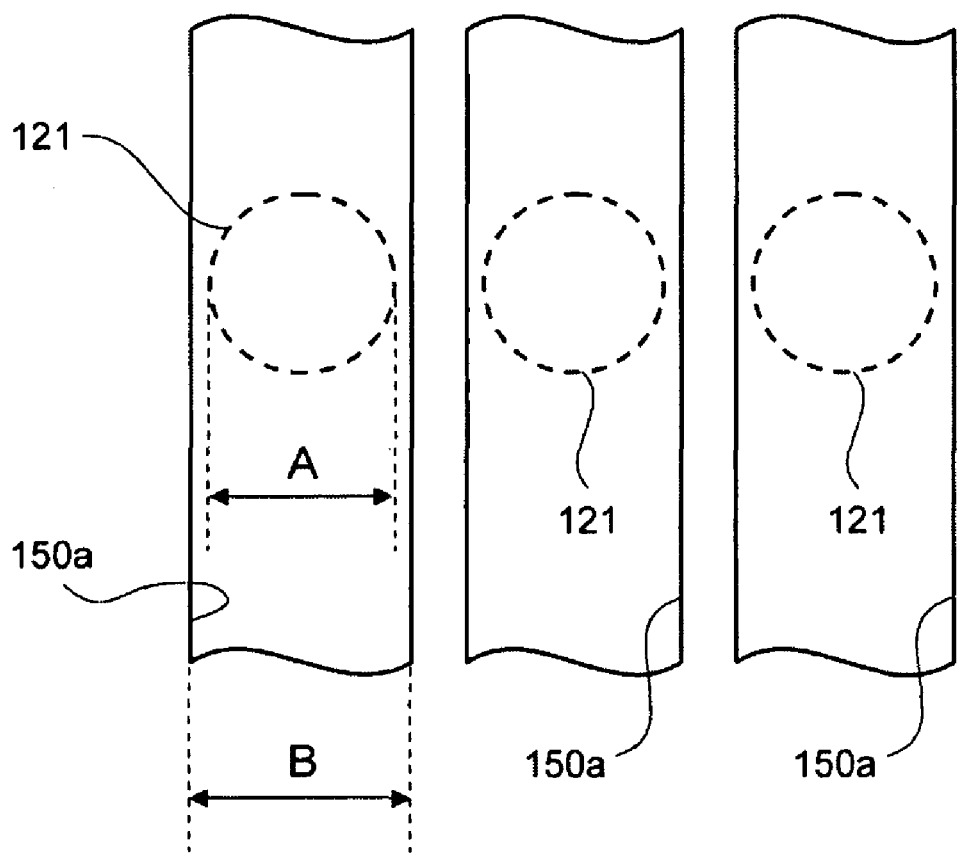
FIG. 12 is a schematic plan view showing a positional relationship between stud bumps and wiring pattern formation regions in case of A<B.
Figure 13:
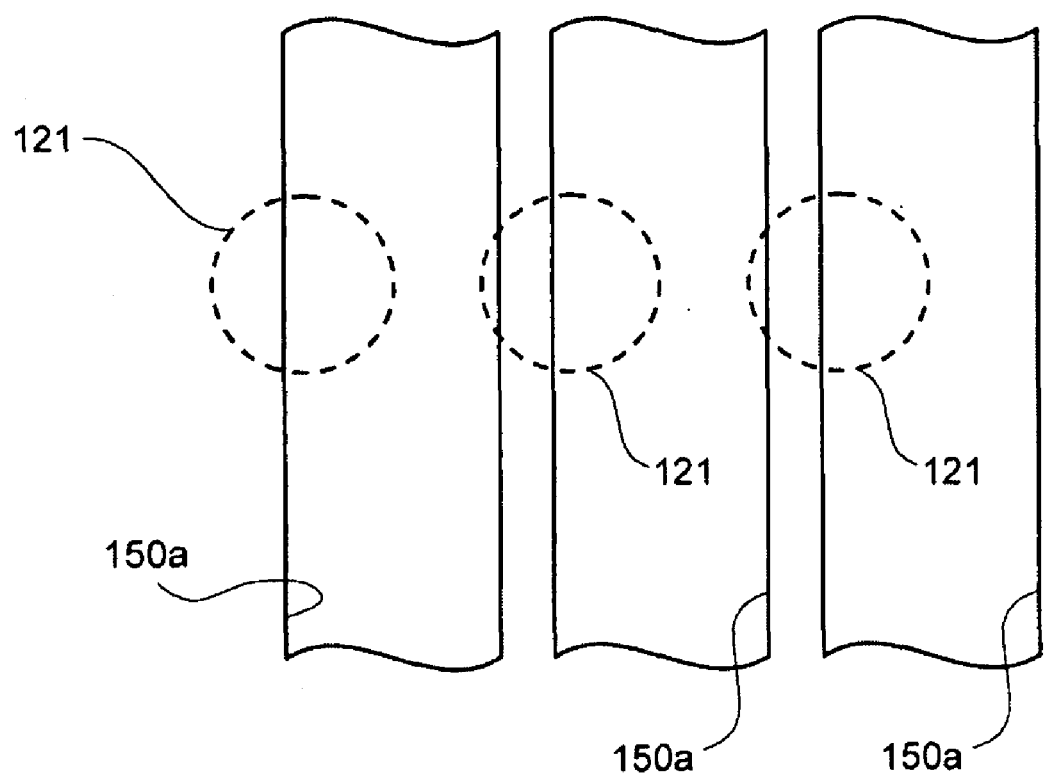
FIG. 13 is a schematic plan view showing a positional relationship between stud bumps and wiring pattern formation regions in the case where significant misalignment occurs.

In other words, as shown in the schematic plan view of FIG. 12, when A<B or A=B (where A is the diameter of the protruding portions of the stud bumps 121, and B is the width of the wiring pattern 150 formation regions 150a), two stud bumps 121 are included within a single region 150a when there is significant misalignment during patterning of the dry films 101, as shown in FIG. 13. When this type of misalignment occurs, these two stud bumps 121 are ultimately connected by the wiring pattern 150, and a short-circuit defect therefore occurs.

Figure 14:
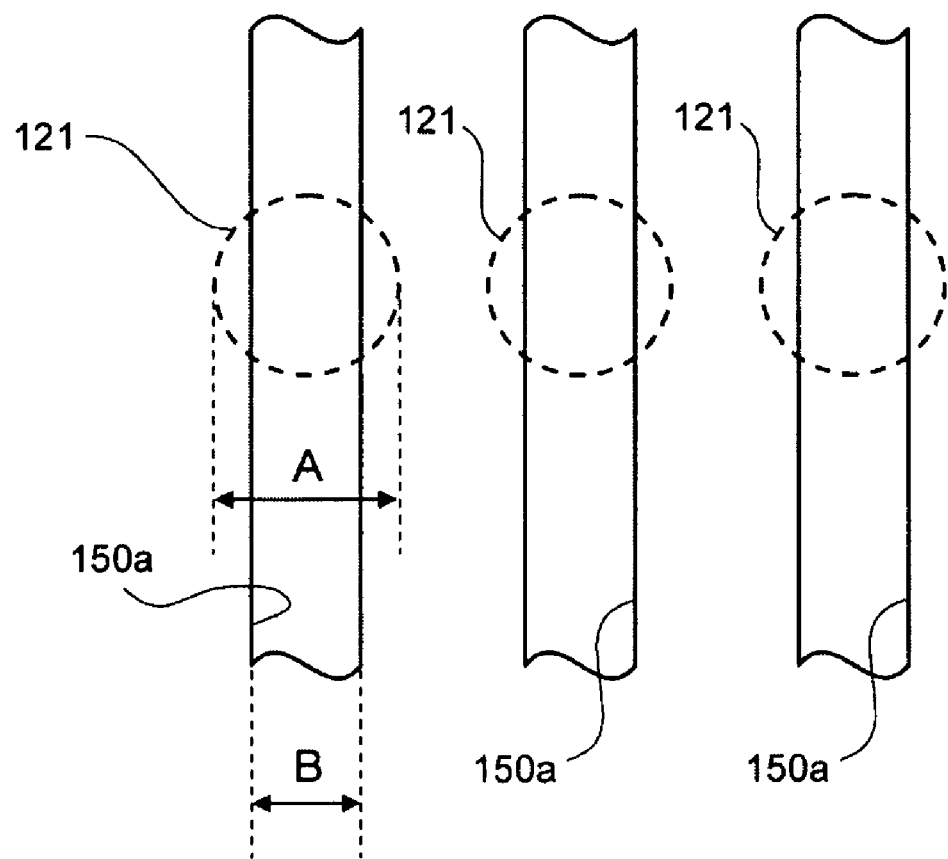
FIG. 14 is a schematic plan view showing a positional relationship between stud bumps and wiring pattern formation regions in case of A>B.

This type of problem is overcome by setting A>B (where A is the diameter of the protruding portions of the stud bumps 121, and B is the width of the wiring pattern 150 formation regions 150a), as shown in FIG. 14. This configuration makes it possible to reduce the likelihood of two stud bumps 121 being included within a single region 150a, even when there is some misalignment during patterning of the dry films 101. Specifically, the margin is enlarged by an amount commensurate with the distance given by A−B, in comparison to a case in which A=B. Accordingly, setting the width B of the regions 150a so that B<A−X (where X is the achievable margin) is satisfied makes it possible to reliably prevent a short circuit between adjacent stud bumps 121.

However, adopting the setting of A>B is not essential to the present invention, and a setting of A<B or A=B is also possible, as in the example shown in FIG. 12.

Figure 15:
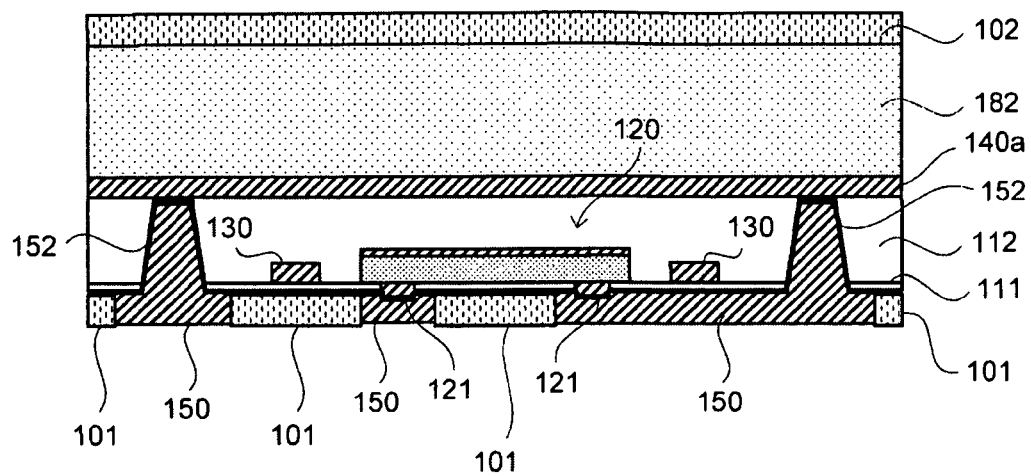
FIG. 15 is a process diagram showing a process of forming wring patterns used to describe a method for manufacturing the semiconductor IC-embedded substrate shown in FIG. 1.

After a portion of the base conductor layer 151 is exposed in this manner, electroplating is performed using the base conductor layer 151 as the base, as shown in FIG. 15. The wiring pattern 150 is thereby formed in the regions 150a in which the base conductor layer 151 is exposed. Accordingly, when the width of the regions 150a is set to B, the width of the wiring pattern 150 thus formed is also B. The insides of the through-holes 112a are also filled by through-electrodes 152. In other words, the through-electrodes 152 penetrate through the resin layers 111, 112, whereby the conductor layer 140a and the wiring pattern 150 are connected to each other via the through-electrodes 152. Since the entire surface of the support substrate 182 is essentially covered by the dry film 102, there is no plating formed on the support substrate 182.

The type of plating solution may be appropriately selected according to the material used to form the wiring pattern 150 and the through-electrodes 152. When the material forming these components is copper (Cu), for example, a copper sulfate solution may be used as the plating solution.

Figure 16:
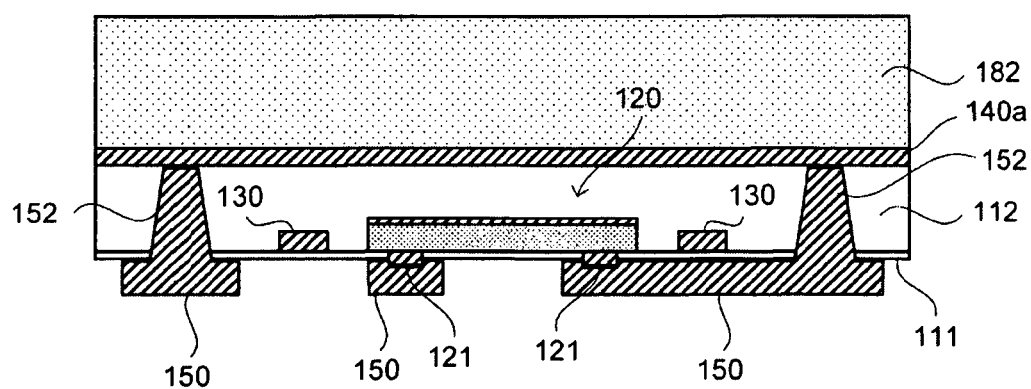
FIG. 16 is a process diagram showing a process of removing dry films and base conductor layer that is a part of the manufacturing process of the semiconductor IC-embedded substrate shown in FIG. 1.

The dry films 101, 102 are then peeled off, and the unnecessary base conductor layer 151 in the portion in which the wiring pattern 150 is not formed is also removed (soft etched) using acid or another etching solution, as shown in FIG. 16.

Figure 17:
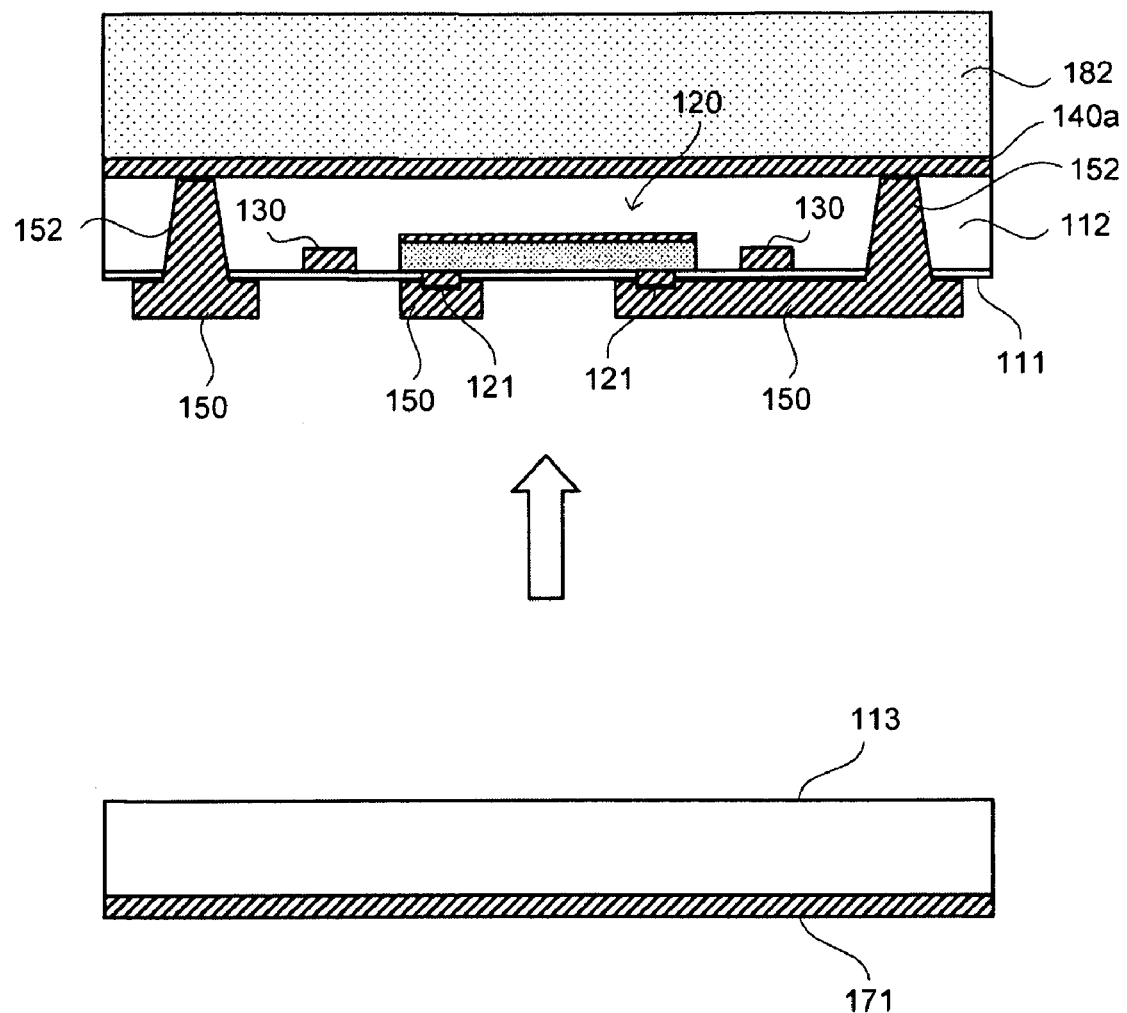
FIG. 17 is a process diagram showing a process of pressing a resin layer (before pressing) that is a part of the manufacturing process of the semiconductor IC-embedded substrate shown in FIG. 1.
Figure 18:
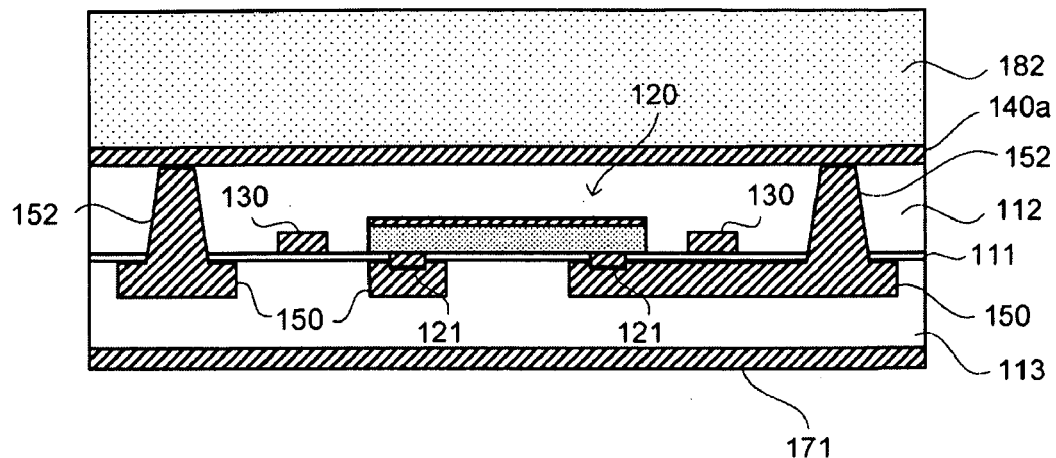
FIG. 18 is a process diagram showing a process of pressing a resin layer (after pressing) that is a part of the manufacturing process of the semiconductor IC-embedded substrate shown in FIG. 1.

A layered sheet composed of a resin layer 113 and a conductor layer 171 is then pressed and heated, as shown in FIG. 17. The wiring pattern 150 and the resin layer 111 are thereby covered by the resin layer 113, in the state shown in FIG. 18.

Figure 19:
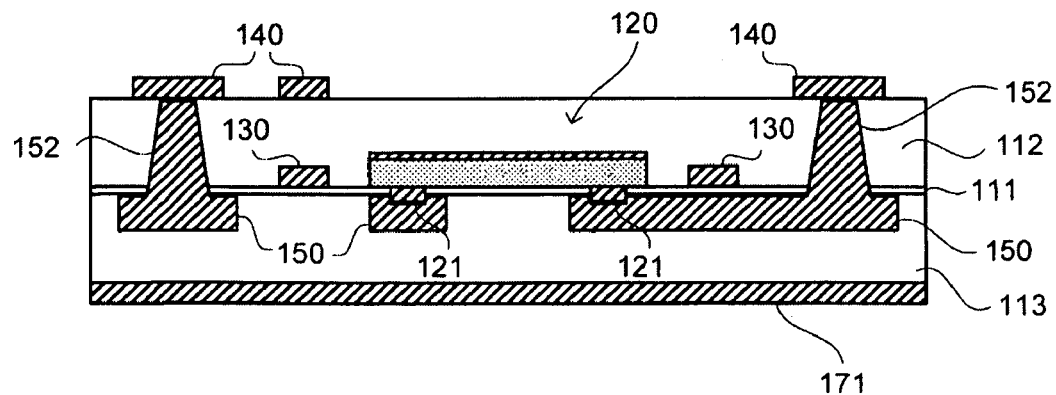
FIG. 19 is a process diagram showing a process of peeling off the support substrate that is a part of the manufacturing process of the semiconductor IC-embedded substrate shown in FIG. 1.

The support substrate 182 that was affixed later is then peeled off, and the exposed conductor layer 140a is patterned to form a wiring pattern 140, as shown in FIG. 19.

Figure 20:
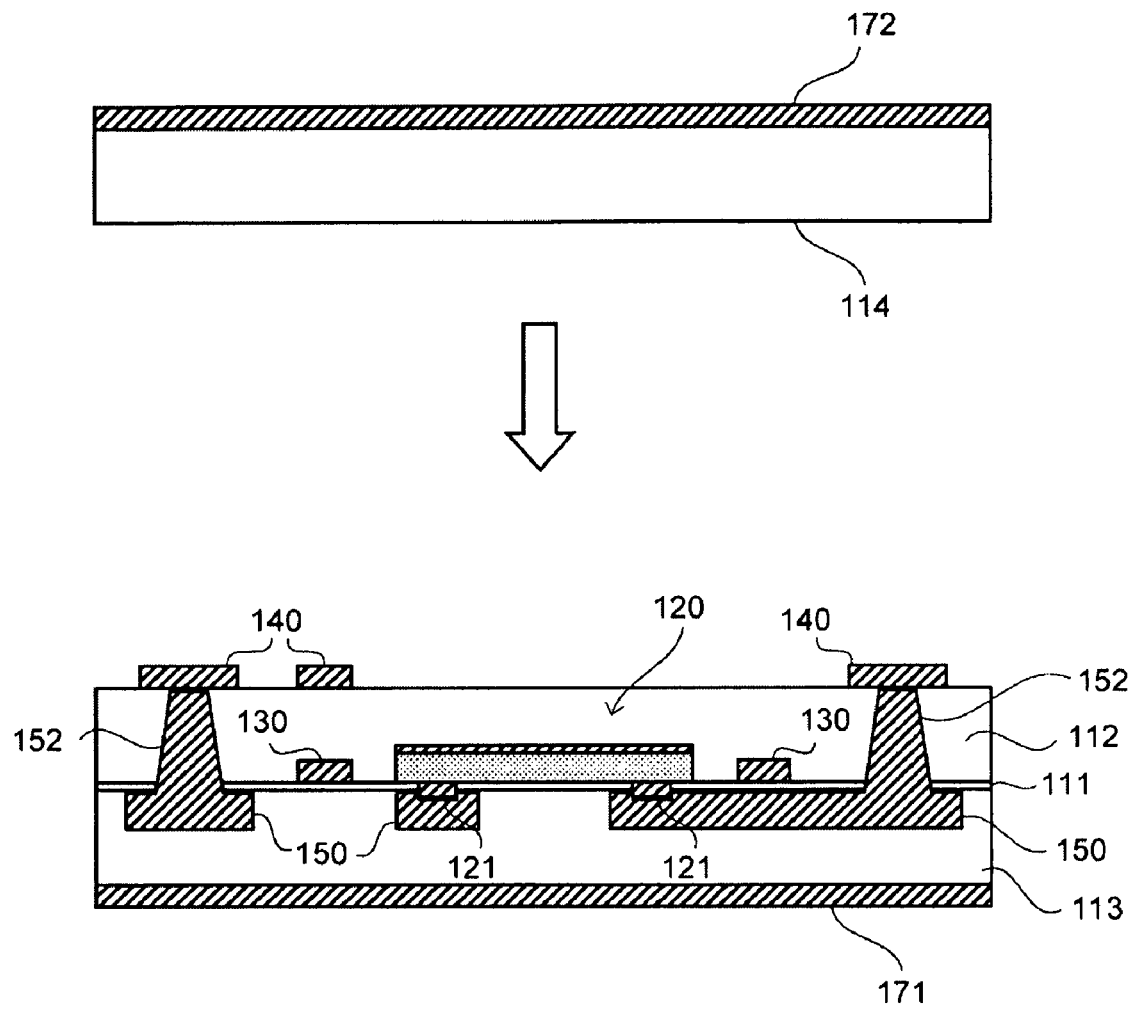
FIG. 20 is a process diagram showing a process of pressing another resin layer (before pressing) that is a part of the manufacturing process of the semiconductor IC-embedded substrate shown in FIG. 1.
Figure 21:
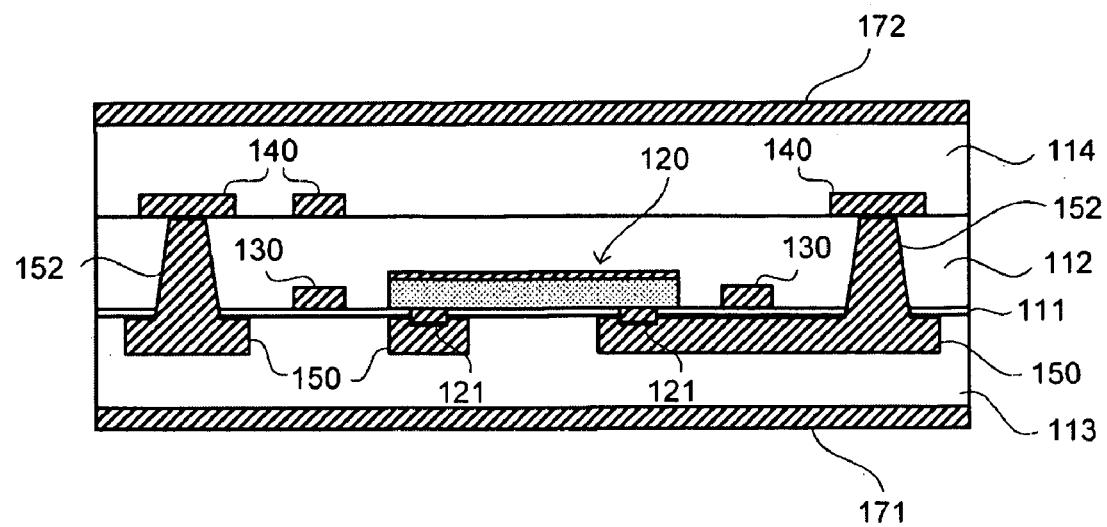
FIG. 21 is a process diagram showing a process of pressing another resin layer (after pressing) that is a part of the manufacturing process of the semiconductor IC-embedded substrate shown in FIG. 1.

A layered sheet composed of a resin layer 114 and a conductor layer 172 is then pressed and heated, as shown in FIG. 20. The wiring pattern 140 and the resin layer 112 are thereby covered by the resin layer 114 in the state shown in FIG. 21.

Figure 22:
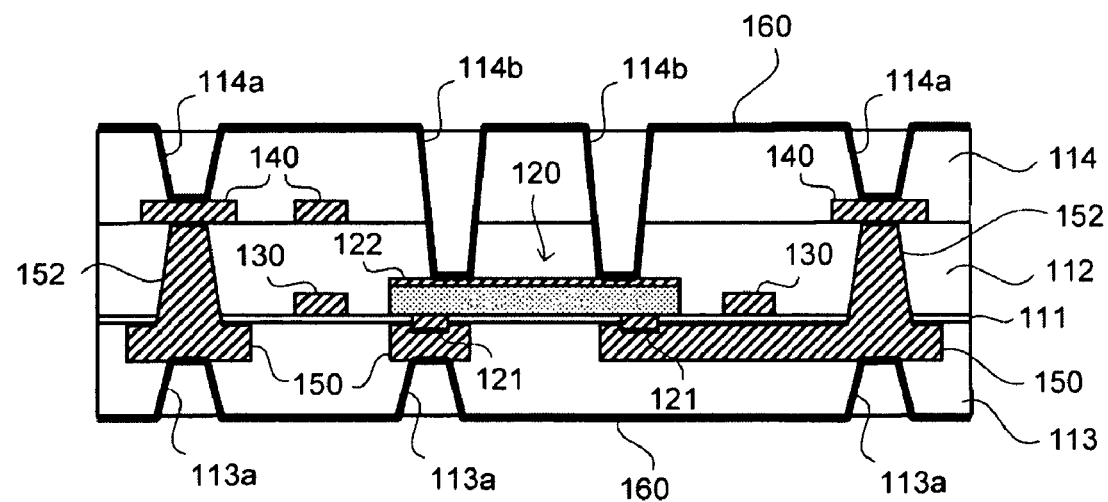
FIG. 22 is a process diagram showing a process of forming through-holes and a base conductor layer that is a part of the manufacturing process of the semiconductor IC-embedded substrate shown in FIG. 1.

After the conductor layers 171 and 172 are then removed or made thinner, through-holes 113a, 114a and 114b are formed by laser irradiation or another method, as shown in FIG. 22. The through-hole 113a penetrates through the resin layer 113 to expose the wiring pattern 150, the through-hole 114a penetrates through the resin layer 114 to expose the wiring pattern 140, and the through-hole 114b penetrates through the resin layers 114 and 112 to expose the metal layer 122.

A thin base conductor layer 160 is formed on the entire surface, including the insides of the through-holes 113a, 114a, 114b, and the same step as the step described using FIGS. 11, 15, and 16 is then performed to form wiring patterns 161 and 162 on the outermost surface shown in FIG. 1. In this step, the inside of the through-hole 113a is filled by a through-electrode 163, whereby the wiring pattern 161 and the wiring pattern 150 are connected to each other. The inside of the through-hole 114a is also filled by a through-electrode 164, whereby the wiring pattern 162 and the wiring pattern 140 are connected to each other. Furthermore, the inside of the through-hole 114b is filled by a through-electrode 165, whereby the wiring pattern 162 and the wiring pattern 122 are connected to each other.

The semiconductor IC-embedded substrate 100 shown in FIG. 1 is thereby completed.

In the present embodiment as described above, the method for exposing the stud bumps 121 involves reducing the overall thickness of the resin layer 111 by a wet blasting method or other method, rather than using laser irradiation. Therefore, the stud bumps 121 can be properly uncovered even when the electrode pitch is narrow. The stud bumps 121 can also be uncovered in a short time regardless of the number of stud bumps 121. Since there is no smearing that occurs when a laser is used to form minute vias, the desmearing process may also be omitted.

In the present embodiment in particular, a wet blasting method is used as the method for uncovering the stud bumps 121, and the stud bumps 121 can be caused to protrude from the surface of the resin layer 111 by adjusting the etching rate/etching conditions. There is therefore no need to remove etching residue or perform other pre-processing prior to forming the base conductor layer 151.

Furthermore, since alignment marks 130 formed on the surface of the resin layer 111 are used as a positioning reference when the semiconductor IC 120 is mounted, a highly precise mounting position can be obtained.

Adopting these aspects of the configuration of the present embodiment makes it possible to overcome the various drawbacks of the prior art that are encountered when a semiconductor IC having a narrow electrode pitch is embedded in a substrate. In the present embodiment, since the semiconductor IC 120 is mounted face-down, the IC can be mounted while an image of the stud bumps 121 is formed from below. It is therefore possible to obtain extremely high precision in the mounting position.

Since the thickness t of the semiconductor IC 120 used in the present embodiment is made extremely low by polishing or the like, the semiconductor IC-embedded substrate 100 as a whole is extremely thin and has a thickness of about 200 μm, for example.

In most of the sequence of steps in the present embodiment, the process is carried out while the substrate being worked is held by the support substrate 181 and support substrate 182. The ease of handling is therefore enhanced, and it is possible to reduce loads placed on the semiconductor IC 120 due to cracking, fragmentation, and deformation of the substrate. It is also possible to prevent dimensional variation and distortion of the substrate during patterning. It is thereby possible to minimize distortion or misalignment between the stud bumps 121 and the wiring pattern 150, and to increase the stability of connections between these components.

When the width (B) of the wiring pattern 150 is set so as to be smaller than the diameter (A) of the protruding portions of the stud bumps 121, short-circuit defects can be prevented even when the electrode pitch is particularly narrow. This configuration is difficult to adopt when a method is used in which the stud bumps 121 are exposed by laser irradiation. A significant advantage is therefore gained in the present embodiment by uncovering the stud bumps 121 using a wet blasting method.

In other words, in a method for exposing the stud bumps 121 by laser irradiation, the limit to which the size of the laser aperture can be reduced is about 50 μm to 80 μm. Since misalignment inevitably occurs during laser irradiation, it is practically impossible to properly expose only the desired stud bumps 121 by using laser irradiation when the diameter of the stud bumps 121 is about 50 to 60 μm, for example. In a case in which the wiring pattern 150 is formed using a semi-additive method after vias are formed by a laser, problems occur in the ability to expose, develop, and peel off the dry films when an attempt is made to set the width (B) of the wiring pattern 150 at or below the diameter of the vias, and it becomes impossible to form the correct pattern. Also when a subtractive method is used, the plating inside the vias is etched, and open circuit defects occur when the width (B) of the wiring pattern 150 is made smaller than the diameter of the vias.

Setting the width (B) of the wiring pattern 150 so as to be smaller than the diameter of the stud bumps 121 is thus extremely problematic when laser irradiation is used as the method for exposing the stud bumps 121. However, since a wet blasting method is used to uncover the stud bumps 121 in the present embodiment, problems such as those described above do not occur, and it is possible to set the width (B) of the wiring pattern 150 so as to be smaller than the diameter (A) of the protruding portions of the stud bumps 121.

The semiconductor IC-embedded substrate according to a second preferred embodiment of the present invention will next be described.

Figure 23:
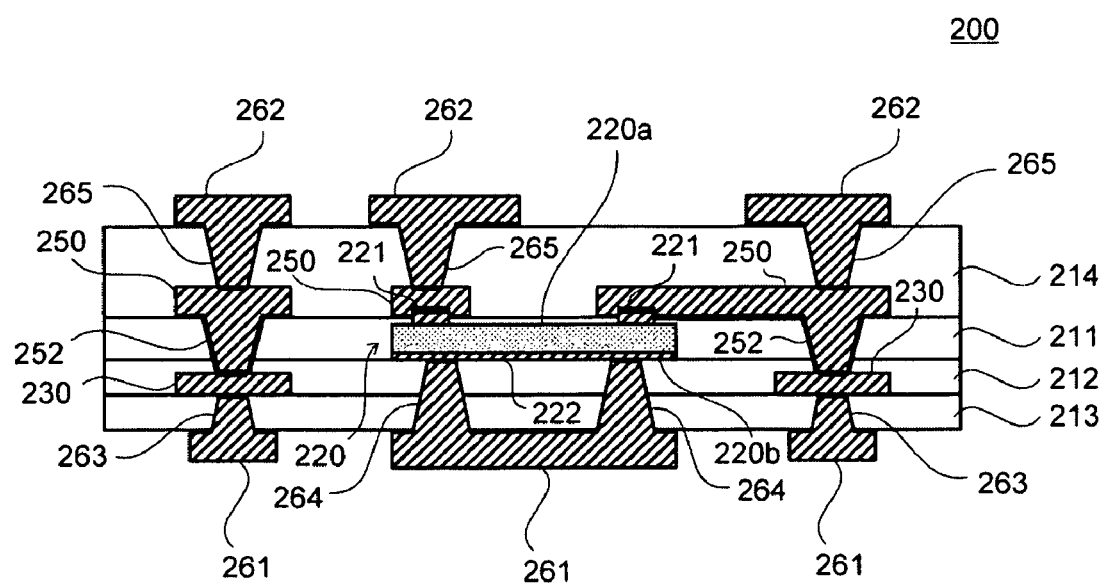
FIG. 23 is a schematic sectional view showing the structure of a semiconductor IC-embedded substrate according to a second preferred embodiment of the present invention.

FIG. 23 is a schematic sectional view showing the structure of the semiconductor IC-embedded substrate 200 according to a second preferred embodiment of the present invention.

As shown in FIG. 23, the semiconductor IC-embedded substrate 200 according to the present embodiment is composed of layered resin layers 211 through 214; a semiconductor IC 220 embedded between resin layer 211 and resin layer 212; alignment marks 230; various types of wiring patterns 250, 261, 262; and through-electrodes 252 and 263 through 265. The semiconductor IC 220 has the same structure as the semiconductor IC 120 shown in FIG. 2. Also in the present embodiment, stud bumps 221 protrude from the surface of the resin layer 211, and are electrically connected to the wiring pattern 250 by the protruding portions thereof.

A capacitor and other passive components may also be mounted to at least one of the wiring patterns 261, 262 of the outermost layer in the present embodiment. The material used to form the resin layers 211 through 214 may be the same as the material used to form the resin layers 111 through 114 in the abovementioned first embodiment.

The method for manufacturing the semiconductor IC-embedded substrate 200 shown in FIG. 23 will next be described with reference to the drawings.

FIGS. 24 through 38 are process diagrams used to describe the method for manufacturing the semiconductor IC-embedded substrate 200 shown in FIG. 23.

Figure 24:
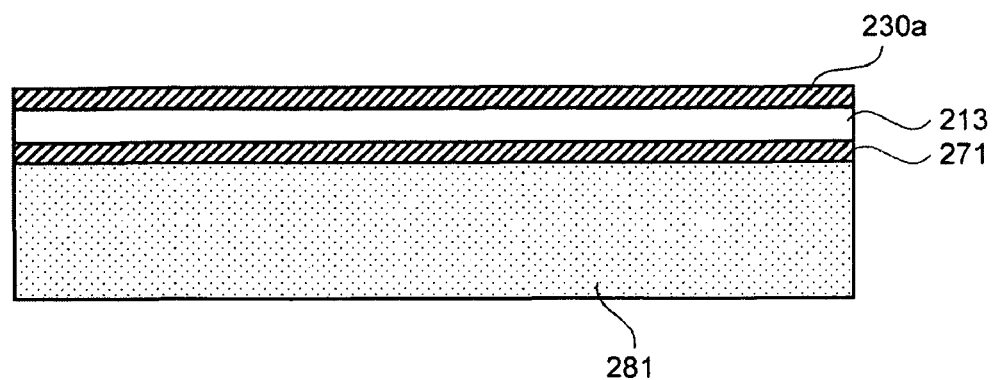
FIG. 24 is a process diagram showing a process of affixing a support substrate that is a part of the manufacturing process of the semiconductor IC-embedded substrate shown in FIG. 23.

First, a resin layer 213 is prepared in which conductor layers 230a, 271 are formed on both surfaces, and a support substrate 281 is affixed to this resin layer 213 as shown in FIG. 24.

Figure 25:
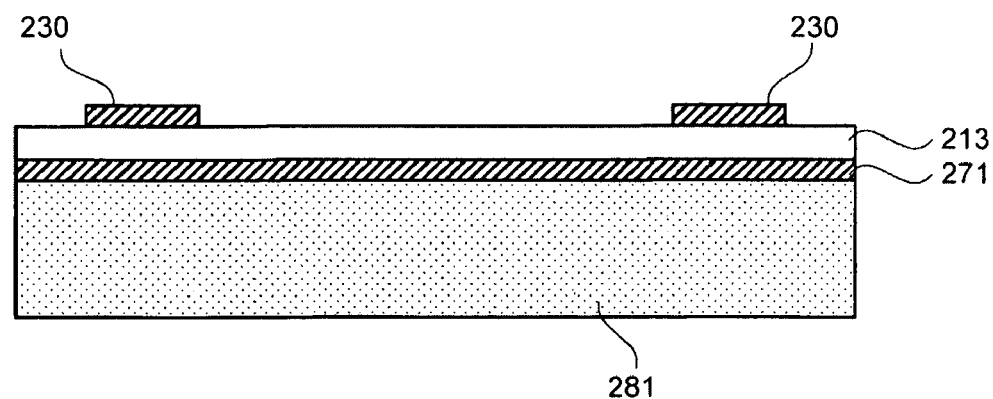
FIG. 25 is a process diagram showing a process of forming alignment marks that is a part of the manufacturing process of the semiconductor IC-embedded substrate shown in FIG. 23.

As shown in FIG. 25, the conductor layer 230a is then patterned to form alignment marks 230. The alignment marks 230 in the present embodiment form a pattern that is also used as an actual wiring pattern.

Figure 26:
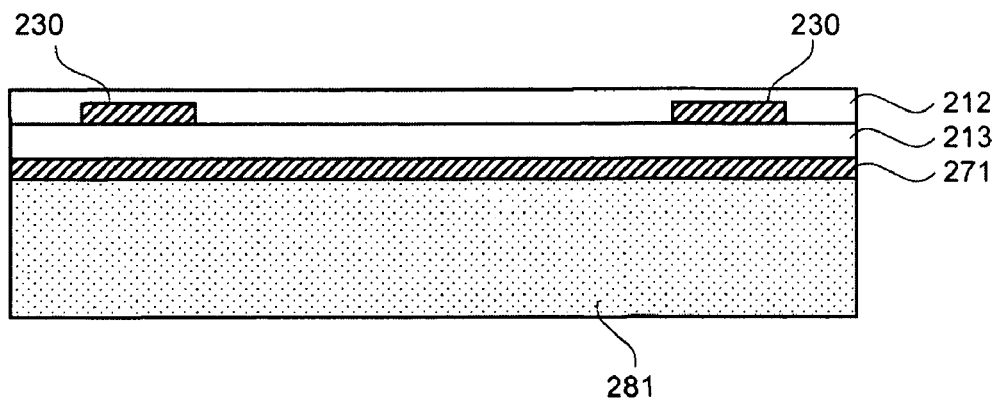
FIG. 26 is a process diagram showing a process of forming a resin layer that is a part of the manufacturing process of the semiconductor IC-embedded substrate shown in FIG. 23.

As shown in FIG. 26, a resin layer 212 is then formed that covers the resin layer 213 and the alignment marks 230.

Figure 27:
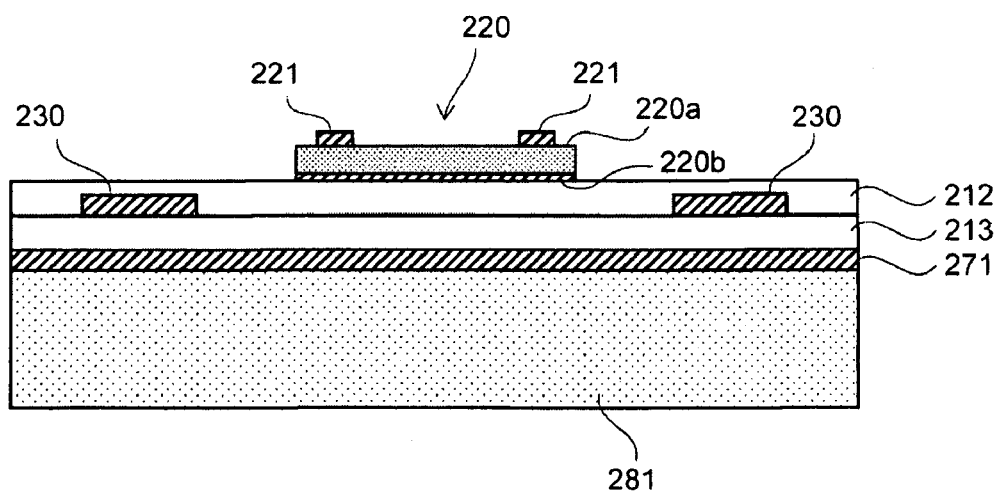
FIG. 27 is a process diagram showing a process of mounting a semiconductor IC that is a part of the manufacturing process of the semiconductor IC-embedded substrate shown in FIG. 23.

The semiconductor IC 220 is then mounted on the surface of the resin layer 212 while being positioned using the alignment marks 230, as shown in FIG. 27. In the present embodiment, the semiconductor IC 220 is mounted face-up, or with the principal surface 220a facing upward. The back surface 220b of the semiconductor IC 220 is thereby completely covered by the resin layer 212.

Figure 28:
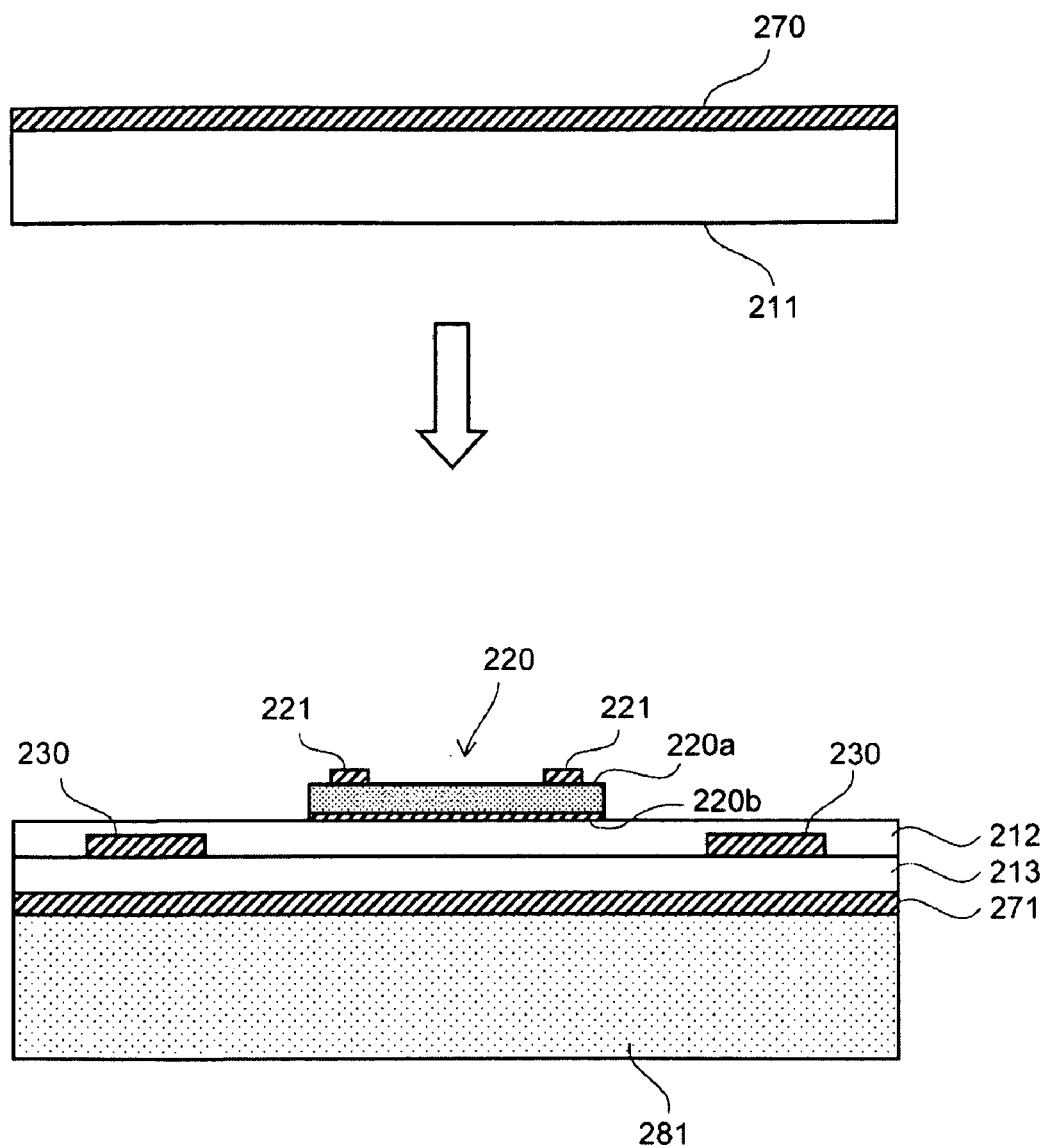
FIG. 28 is a process diagram showing a process of pressing a resin layer (before pressing) that is a part of the manufacturing process of the semiconductor IC-embedded substrate shown in FIG.
Figure 29:
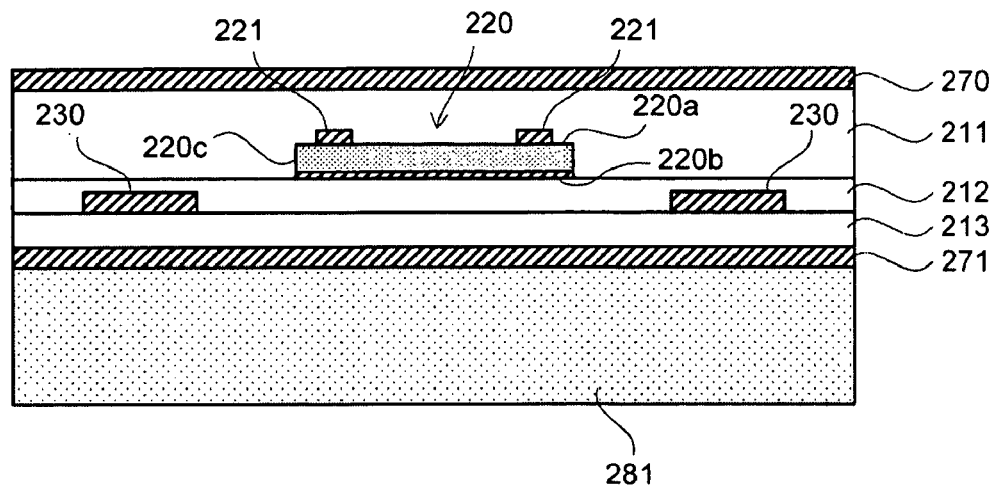
FIG. 29 is a process diagram showing a process of pressing a resin layer (after pressing) that is a part of the manufacturing process of the semiconductor IC-embedded substrate shown in FIG. 23.

A layered sheet composed of a resin layer 211 and a conductor layer 270 is then stacked so that the resin layer 211 and the principal surface 220a of the semiconductor IC 220 face each other, and the assembly is pressed together while being heated, as shown in FIG. 28. This process creates a state in which the principal surface 220a and side surface 220c of the semiconductor IC 220 are completely covered by the resin layer 211, as shown in FIG. 29. In other words, a state occurs at this time in which the semiconductor IC 220 is held between the resin layers 211 and 212.

Figure 30:
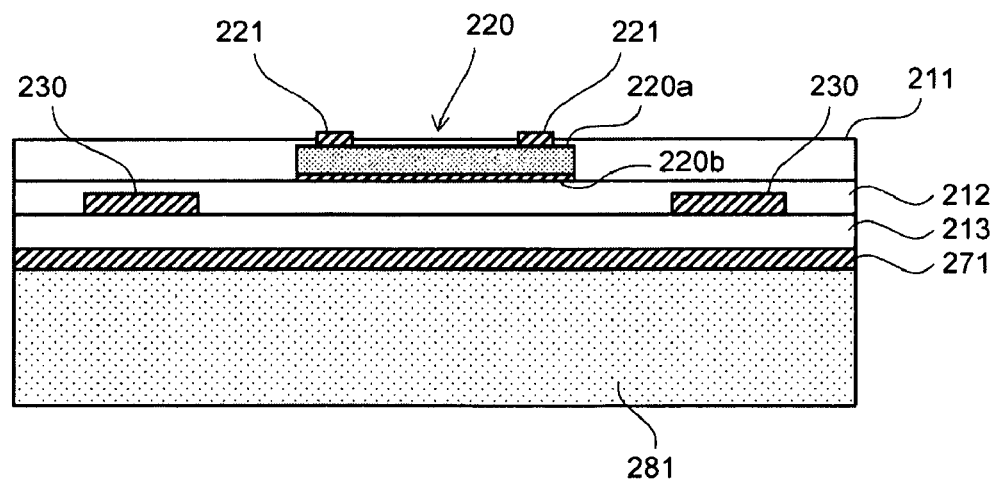
FIG. 30 is a process diagram showing a process of etching the resin layer that is a part of the manufacturing process of the semiconductor IC-embedded substrate shown in FIG. 23.

The surface of the resin layer 211 is then etched using a wet blasting method or other method after the conductor layer 270 is removed, as shown in FIG. 30. The stud bumps 221 provided to the semiconductor IC 220 are then caused to protrude from the surface of the resin layer 211 by adjusting the etching rate/etching conditions in the same manner as in the embodiment described above.

Figure 31:
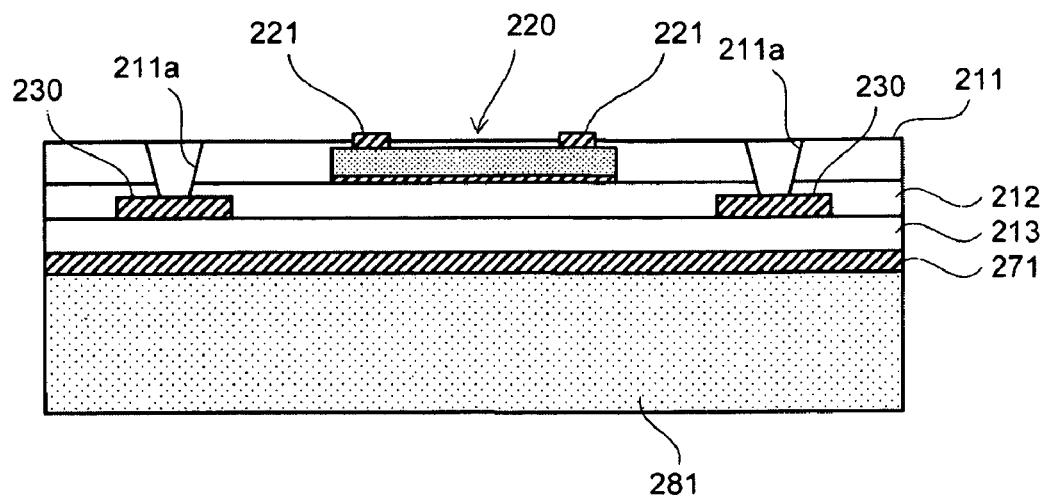
FIG. 31 is a process diagram showing a process of forming through-holes that is a part of the manufacturing process of the semiconductor IC-embedded substrate shown in FIG. 23.

As shown in FIG. 31, through-holes 211a that penetrate through the resin layers 211, 212 are then formed by laser irradiation from the direction of the resin layer 211. However, a method other than laser irradiation may also be used to form the through-holes 211a.

Figure 32:
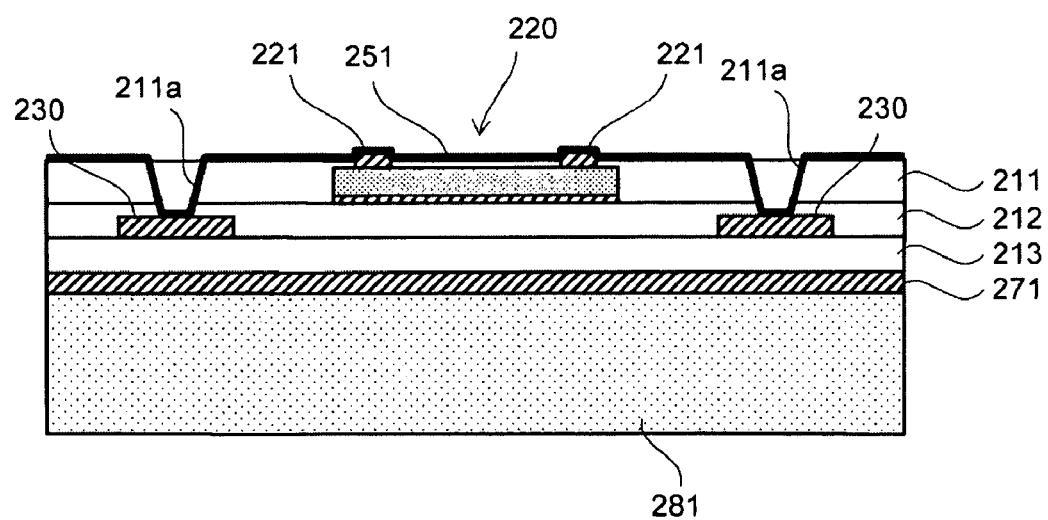
FIG. 32 is a process diagram showing a process of forming a base conductor layer that is a part of the manufacturing process of the semiconductor IC-embedded substrate shown in FIG. 23.

As shown in FIG. 32, a sputtering method or other vapor-phase growth method is used to form a thin base conductor layer 251 on the entire surface of the resin layer 211, including the insides of the through-holes 211*a*. The protruding portions of the stud bumps 221 and the portions of the alignment marks 230 that are exposed at the bottoms of the through-holes 211*a* are thereby directly covered by the base conductor layer 251. Since a wet blasting treatment is also used in the present embodiment to cause the stud bumps 221 to protrude from the surface of the resin layer 211, there is no need to remove etching residue or perform other preprocessing before forming the base conductor layer 251.

Figure 33:
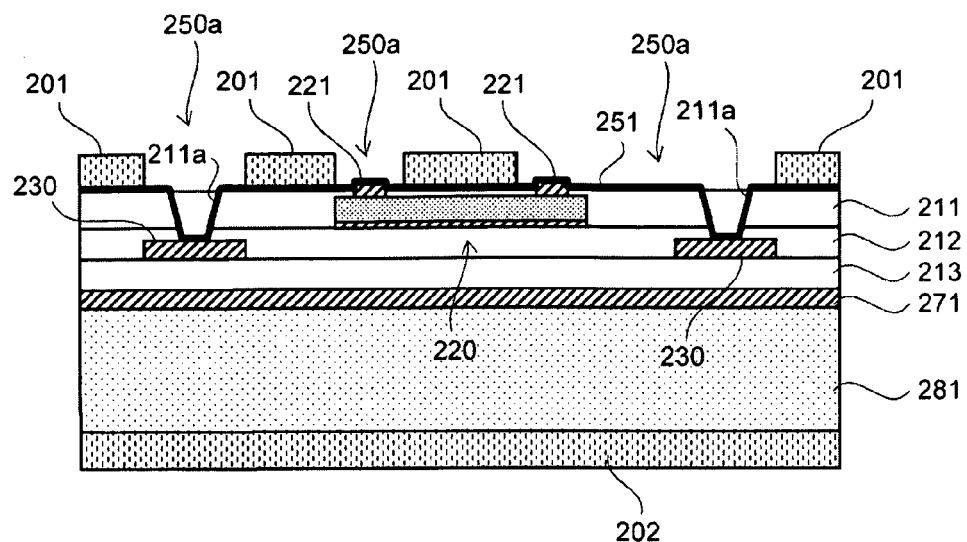
FIG. 33 is a process diagram showing a process of affixing and exposing dry films that is a part of the manufacturing process of the semiconductor IC-embedded substrate shown in FIG. 23.

Light-sensitive dry films 201, 202 are then affixed to both surfaces of the substrate, i.e., to the surface of the base conductor layer 251 and the surface of the support substrate 281, as shown in FIG. 33. The dry films 201 are then exposed using a photomask not shown in the drawing, and the dry films 201 are removed from the regions 250*a* in which the wiring pattern 250 is to be formed. The base conductor layer 251 is thereby exposed in the regions 250*a* in which the wiring pattern 250 is to be formed. The dry film 202 is not removed at this time, thus maintaining a state in which the entire surface of the support substrate 281 is essentially covered.

As shown in FIG. 33, regions that correspond to the stud bumps 221 are also included in the present embodiment in the regions 250*a* in which the wiring pattern 250 is to be formed. However, since the position of the semiconductor IC 220 is aligned with respect to the alignment marks 230, there is little misalignment in the planar direction of the positions of the stud bumps 221 and the regions 250*a* in relation to each other.

When the electrode pitch herein is particularly narrow, the relation A>B is preferred, where A is the diameter of the protruding portions of the stud bumps 221, and B is the width of the regions 250*a* in which the wiring pattern 250 is to be formed.

Figure 34:
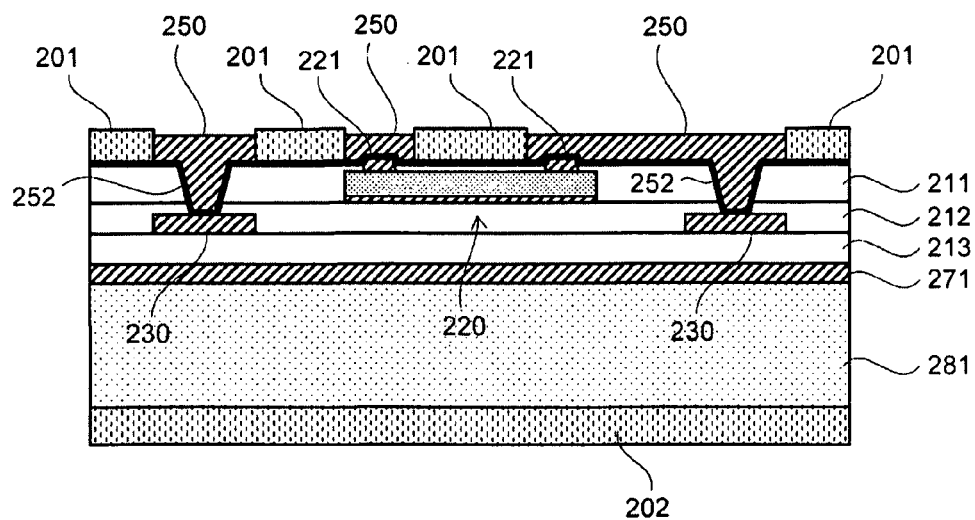
FIG. 34 is a process diagram showing a process of forming wring patterns used to describe a method for manufacturing the semiconductor IC-embedded substrate shown in FIG. 23.

After a portion of the base conductor layer 251 is exposed in this manner, electroplating is performed using the base conductor layer 251 as the base, as shown in FIG. 34. The wiring pattern 250 is thereby formed in the regions 250*a* in which the base conductor layer 251 is exposed. Accordingly, when the width of the regions 250*a* is set to B, the width of the wiring pattern 250 thus formed is also B. The insides of the through-holes 211*a* are also filled by through-electrodes 252. In other words, the through-electrodes 252 penetrate through the resin layers 211, 212, whereby the alignment marks 230 and the wiring pattern 250 are connected to each other via the through-electrodes 252. Since the entire surface of the support substrate 281 is essential covered by the dry film 202, there is no plating formed on the support substrate 281.

Figure 35:
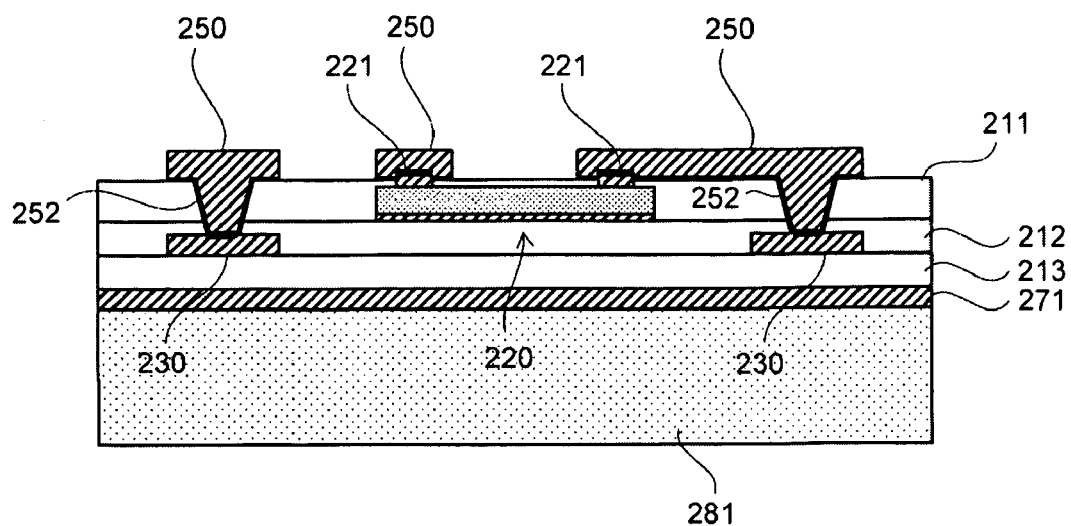
FIG. 35 is a process diagram showing a process of removing dry films and base conductor layer that is a part of the manufacturing process of the semiconductor IC-embedded substrate shown in FIG. 23.

The dry films 201, 202 are then peeled off, and the unnecessary base conductor layer 251 in the portion in which the wiring pattern 250 is not formed is also removed (soft etched) using acid or another etching solution, as shown in FIG. 35.

Figure 36:
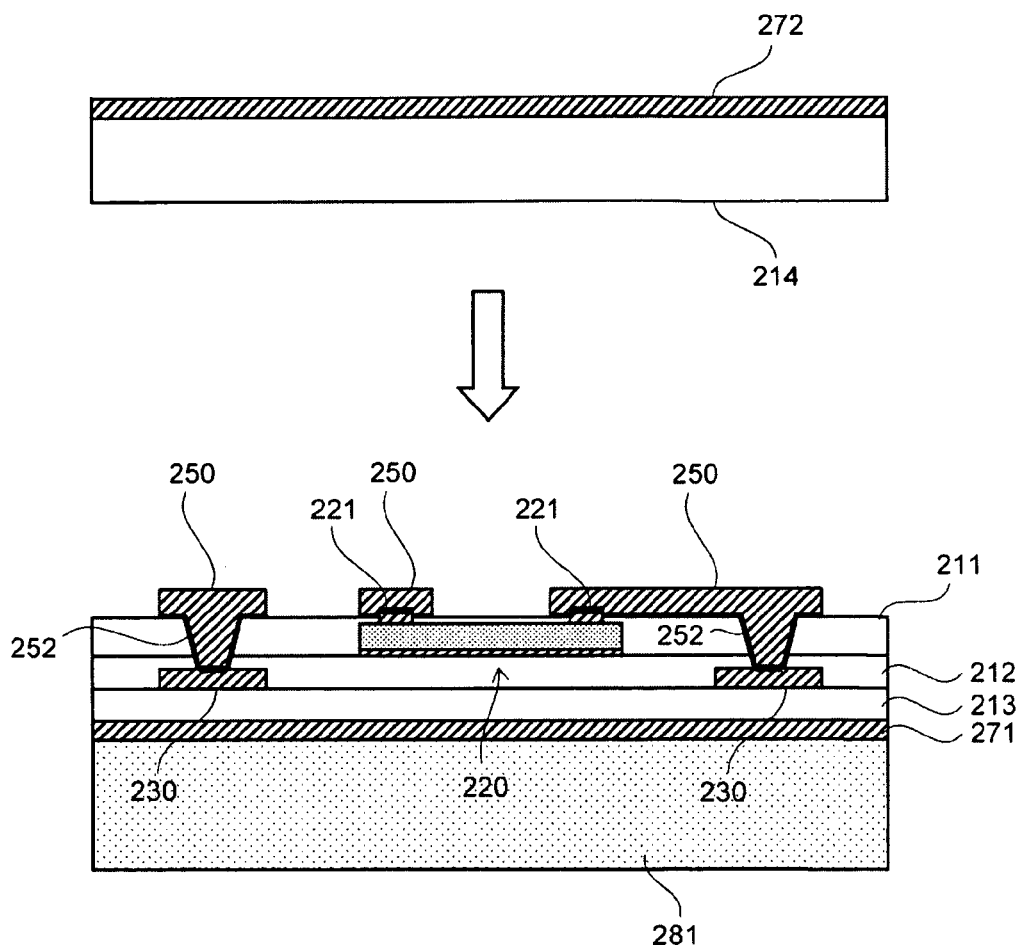
FIG. 36 is a process diagram showing a process of pressing a resin layer (before pressing) that is a part of the manufacturing process of the semiconductor IC-embedded substrate shown in FIG. 23.
Figure 37:
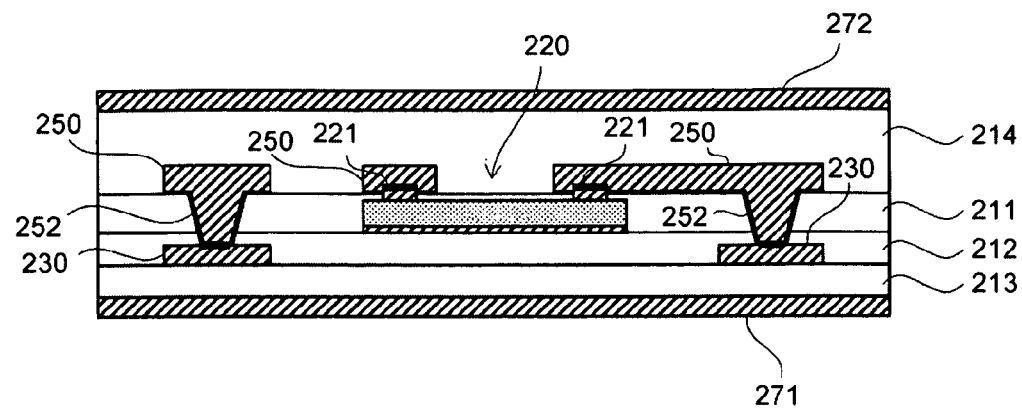
FIG. 37 is a process diagram showing a process of pressing a resin layer (after pressing) that is a part of the manufacturing process of the semiconductor IC-embedded substrate shown in FIG. 23.

A layered sheet composed of a resin layer 214 and a conductor layer 272 is then pressed and heated, as shown in FIG. 36. The wiring pattern 250 and the resin layer 211 are thereby covered by the resin layer 214, in the state shown in FIG. 37. The support substrate 281 is then peeled off.

Figure 38:
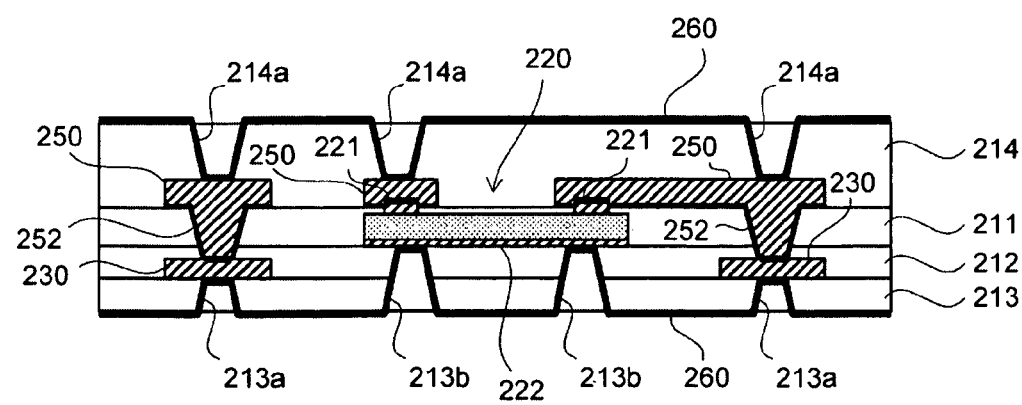
FIG. 38 is a process diagram showing a process of forming through-holes and a base conductor layer that is a part of the manufacturing process of the semiconductor IC-embedded substrate shown in FIG. 23.

After the conductor layers 271 and 272 are then removed or made thinner, through-holes 213*a*, 213*b* and 214*a* are formed by laser irradiation or another method, as shown in FIG. 38. The through-hole 213*a* penetrates through the resin layer 213 to expose the alignment marks 230, the through-hole 213*b* penetrates through the resin layers 213, 212 to expose the metal layer 222, and the through-hole 214*a* penetrates through the resin layer 214 to expose the wiring pattern 250.

A thin base conductor layer 260 is formed on the entire surface, including the insides of the through-holes 213*a*, 213*b*, 214*a*, and the same step as the step described using FIGS. 33 through 35 is then performed to form wiring patterns 261, 262 on the outermost surface shown in FIG. 23. In this step, the inside of the through-hole 213*a* is filled by a through-electrode 263, whereby the wiring pattern 261 and the alignment marks 230 are connected to each other. The inside of the through-hole 213*b* is also filled by a through-electrode 264, whereby the wiring pattern 262 and the metal layer 222 are connected to each other. Furthermore, the inside of the through-hole 214*a* is filled by a through-electrode 265, whereby the wiring pattern 262 and the wiring pattern 250 are connected to each other.

The semiconductor IC-embedded substrate 200 shown in FIG. 23 is thereby completed.

As described above, the overall thickness of the resin layer 211 is also reduced in the present embodiment by a wet blasting method or other method, whereby the stud bumps 221 are caused to protrude from the surface of the resin layer 211. It is therefore possible to obtain the same effects as those of the first embodiment. Since the semiconductor IC 220 is mounted face-up in the present embodiment, only one support substrate 281 is needed, and there is no need to affix another support substrate during the process. Deformation of the substrate and other defects can therefore be prevented by a simpler process.

The present invention is in no way limited to the aforementioned embodiments, but rather various modifications are possible within the scope of the invention as recited in the claims, and naturally these modifications are included within the scope of the invention.

Figure 39:
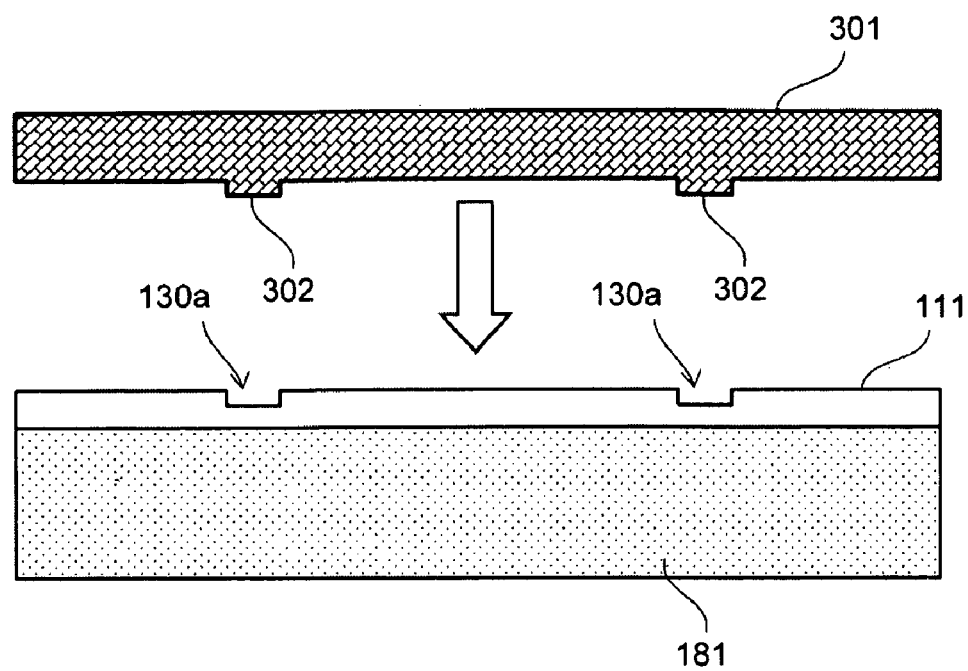
FIG. 39 is a view used to describe the method for forming depressions in the resin layer.
Figure 40:
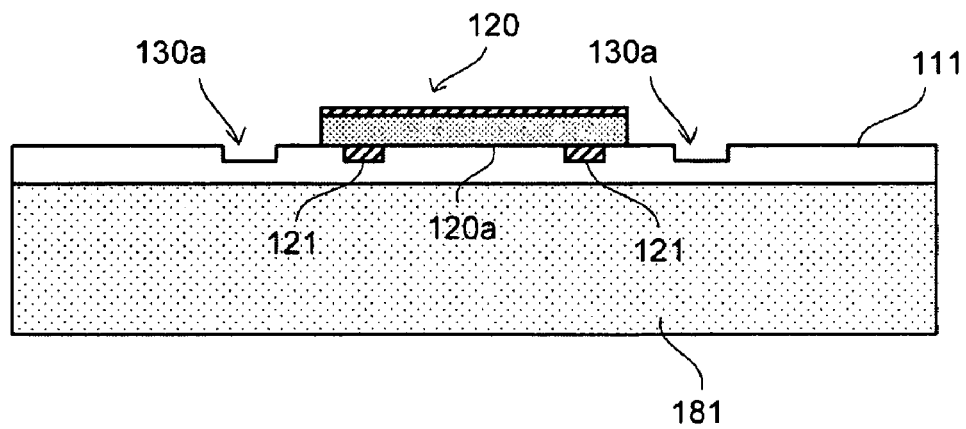
FIG. 40 is a view showing a state in which the semiconductor IC is mounted using as alignment marks the depressions provided to the resin layer.

For example, a conductor pattern is used as an alignment marking in the first and second embodiments described above, but the alignment marks are not limited to being composed of a conductor pattern, and depressions or the like provided to a resin layer may also be used as the alignment marks. In one possible example, depressions 130*a* are formed in a resin layer 111 by pressing using a die 301 that has protrusions 302, as shown in FIG. 39. A semiconductor IC 120 is then mounted using the depressions 130*a* as alignment marks, as shown in FIG. 40.

In the first embodiment, the alignment marks 130 are provided to the surface of the resin layer 111 on the side on which the semiconductor IC 120 is mounted. However, this configuration does not limit the positioning of the alignment marks 130, and the alignment marks 130 may also be provided to the surface on the opposite side of the resin layer 111, for example. Similarly in the second embodiment, the alignment marks 230 are provided to the opposite surface of the resin layer 212 from the side on which the semiconductor IC 220 is mounted. However, this configuration does not limit the positioning of the alignment marks 230, and the alignment marks 230 may also be provided to the surface on the opposite side of the resin layer 212, for example.

Figure 41:
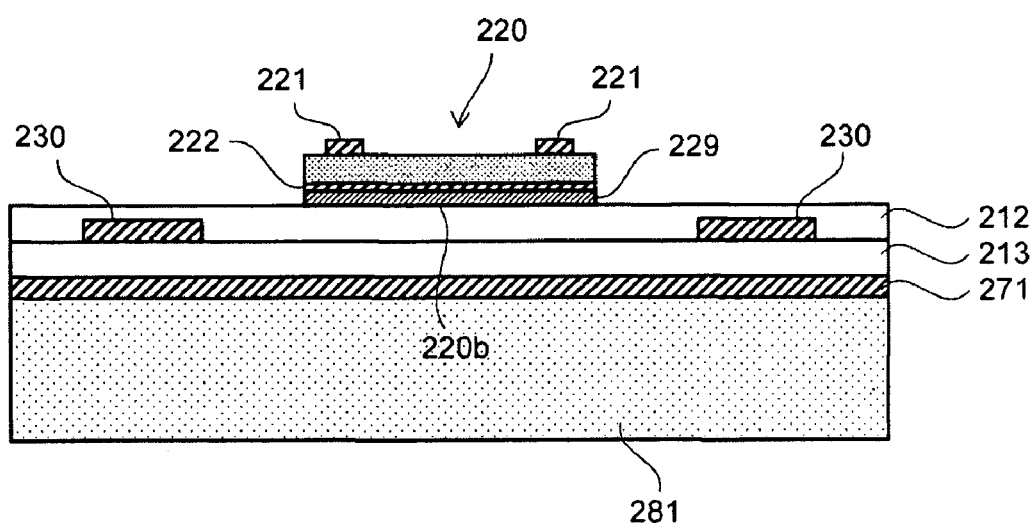
FIG. 41 is a view showing a state in which the semiconductor IC is mounted to the resin layer by means of the die attach film.

The semiconductor IC is also mounted directly on a resin layer in the first and second embodiments described above, but it is also possible to provide a die attach film to the semiconductor IC and to mount the semiconductor IC to a resin layer via the die attach film. In one possible example, a die attach film 229 is provided to the back surface of the semiconductor IC 220 as shown in FIG. 41, and the semiconductor IC 220 is temporarily fixed to the resin layer 212 by bonding the die attach film 229 and the resin layer 212. In this case, there is no need for the resin layer 212 to have adhesive properties. In the case of the example shown in FIG. 42, a die attach film 229 is interposed between the resin layer 212 and the back surface 220*b* of the semiconductor IC 220 (*2), and these two components are therefore no longer in direct contact with each other. However, the back surface 220*b* of the semiconductor IC 220 (*2) is then covered by the resin layer 212 via the die attach film 229.

What is claimed is:

1. A semiconductor IC-embedded substrate, comprising:
a semiconductor IC in which conductive protrusions are provided to a principal surface of the semiconductor IC:
a first resin layer for covering the principal surface of the semiconductor IC;
a second resin layer for covering a back surface of the semiconductor IC;
a wiring pattern formed on the surface of the first resin layer and connected to the conductive protrusions, a width of the wiring pattern on the conductive protrusions is smaller than a diameter of a protruding portion of the conductive protrusions; and
wherein the conductive protrusions of the semiconductor IC protrude from a surface of the first resin layer.

2. The semiconductor IC-embedded substrate as claimed in claim 1, wherein at least one of the first and second resin layers is in contact with a side surface of the semiconductor IC.

3. The semiconductor IC-embedded substrate as claimed in claim 1, wherein the first resin layer is in contact with the principal surface of the semiconductor IC, and the second resin layer is in contact with the back surface of the semiconductor IC.

4. The semiconductor IC-embedded substrate as claimed in claim 1, further comprising a die attach film provided to one surface selected from the principal surface and the back surface of the semiconductor IC,
the one surface selected from the principal surface and the back surface of the semiconductor IC is covered by one layer selected from the first and second resin layers via the die attach film.

5. The semiconductor IC-embedded substrate as claimed in claim 1, further comprising a through-electrode that is provided through the first and second resin layers.

6. The semiconductor IC-embedded substrate as claimed in claim 1, wherein the semiconductor IC is thinned.

7. The embedded semiconductor IC device as claimed in claim 1, further comprising:
alignment marks formed on the first surface or second surface the first resin layer, wherein the semiconductor IC is mounted and aligned on the second surface of the first resin layer based on the alignment marks.

8. An embedded semiconductor IC device, comprising:
a semiconductor IC in which conductive protrusions having a predetermined height are provided to a principal surface of the semiconductor IC;
a first resin layer covering at least the principle surface of the semiconductor IC and having a thickness at least above the principle surface of the semiconductor IC that is less than the predetermined height of the conductive protrusions;
a second resin layer covering a surface opposite the primary surface of the semiconductor IC;
a wiring pattern formed on a first surface of the first resin layer and connected to the conductive protrusions; and
a width of the wiring pattern on the conductive protrusions is smaller than a diameter of a protruding portion of the conductive protrusions 9. The embedded semiconductor IC device as claimed in claim 8, wherein a second surface of the first resin layer and the principal surface of the semiconductor IC face each other and a first surface of the second resin layer and a back surface of the semiconductor IC face each other.

10. The embedded semiconductor IC device as claimed in claim 9, further comprising:
alignment marks formed on the first surface or second surface of the first resin layer, wherein the semiconductor IC is mounted and aligned on the second surface of the first resin layer based on the alignment marks.

11. The embedded semiconductor IC device as claimed in claim 9, further comprising:
a first support substrate in contact with and covering at least a portion of the first resin layer; and
a second support substrate in contact with and covering at least a portion of the second resin layer.

12. The embedded semiconductor IC device as claimed in claim 8, further comprising:
a through-electrode that penetrates through the first and second resin layers.

13. The embedded semiconductor IC device as claimed in claim 8, further comprising:
alignment marks formed on the first surface or second surface of the first resin layer, wherein the semiconductor IC is mounted and aligned on the second surface of the first resin layer based on the alignment marks.

14. A semiconductor IC-embedded substrate, comprising:
a semiconductor IC in which conductive protrusions are provided to a principal surface of the semiconductor IC;
a first resin layer for covering the principal surface of the semiconductor IC;
a second resin layer for covering a back surface of the semiconductor IC; and
alignment marks formed on the first surface or second surface of the first resin layer, wherein the semiconductor IC is mounted and aligned on the second surface of the first resin layer based on the alignment marks and wherein the conductive protrusions of the semiconductor. IC protrude from a surface of the first resin layer.

* * * * *

UNITED STATES PATENT AND TRADEMARK OFFICE
CERTIFICATE OF CORRECTION

| | | |
|---|---|---|
| PATENT NO. | : 8,026,614 B2 | |
| APPLICATION NO. | : 12/435385 | |
| DATED | : September 27, 2011 | |
| INVENTOR(S) | : Kenichi Kawabata and Takaaki Morita | |

It is certified that error appears in the above-identified patent and that said Letters Patent is hereby corrected as shown below:

Col. 17, claim 1, line 7: ":" should be changed to ";"

Signed and Sealed this
Fourteenth Day of February, 2012

David J. Kappos
*Director of the United States Patent and Trademark Office*